United States Patent
Arai et al.

(10) Patent No.: US 11,342,452 B2
(45) Date of Patent: May 24, 2022

(54) MOSFET, HAVING A SEMICONDUCTOR BASE SUBSTRATE WITH A SUPER JUNCTION STRUCTURE, METHOD OF MANUFACTURING THE MOSFET, AND POWER CONVERSION CIRCUIT HAVING THE MOSFET

(71) Applicant: SHINDENGEN ELECTRIC MANUFACTURING CO., LTD., Tokyo (JP)

(72) Inventors: Daisuke Arai, Saitama (JP); Mizue Kitada, Saitama (JP); Takeshi Asada, Saitama (JP); Noriaki Suzuki, Saitama (JP); Koichi Murakami, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 247 days.

(21) Appl. No.: 16/603,700

(22) PCT Filed: Dec. 27, 2017

(86) PCT No.: PCT/JP2017/047082
§ 371 (c)(1),
(2) Date: Oct. 8, 2019

(87) PCT Pub. No.: WO2019/130513
PCT Pub. Date: Jul. 4, 2019

(65) Prior Publication Data
US 2020/0119187 A1    Apr. 16, 2020

(51) Int. Cl.
*H01L 29/78* (2006.01)
*H01L 29/06* (2006.01)
(Continued)

(52) U.S. Cl.
CPC ...... *H01L 29/7813* (2013.01); *H01L 29/0634* (2013.01); *H01L 29/32* (2013.01); *H01L 29/66734* (2013.01)

(58) Field of Classification Search
CPC . H01L 29/7813; H01L 29/0634; H01L 29/32; H01L 29/66734; H01L 21/263;
(Continued)

(56) References Cited

U.S. PATENT DOCUMENTS

2011/0147829 A1    6/2011  Nakajima
2014/0231910 A1    8/2014  Willmeroth et al.
(Continued)

FOREIGN PATENT DOCUMENTS

JP    2015-135987 A    7/2015
JP    2017-59712 A     3/2017
JP    2017-98449 A     6/2017

OTHER PUBLICATIONS

International Search Report in PCT/JP2017/047082, dated Mar. 13, 2018. 4pp.
(Continued)

*Primary Examiner* — Mohammad M Hoque
(74) *Attorney, Agent, or Firm* — Hauptman Ham, LLP

(57) ABSTRACT

A MOSFET includes: a semiconductor base substrate having an n-type column region and a p-type column region, the n-type column region and the p-type column region forming a super junction structure; and a gate electrode formed by way of a gate insulation film. Assuming a region of the semiconductor base substrate which provides a main operation of the MOSFET as an active region, a region of the semiconductor base substrate maintaining a withstand voltage of the MOSFET as an outer peripheral region, and a region of the semiconductor base substrate disposed between the active region and the outer peripheral region as
(Continued)

an active connecting region, out of the active region, the active connecting region, and the outer peripheral region of the semiconductor base substrate, the crystal defects are formed only in the active region and the active connecting region.

10 Claims, 9 Drawing Sheets

(51) Int. Cl.
*H01L 29/32* (2006.01)
*H01L 29/66* (2006.01)

(58) Field of Classification Search
CPC ......... H01L 21/26506; H01L 29/66727; H01L 29/7811; H01L 29/78; H02M 3/155

USPC ........................................................ 257/330
See application file for complete search history.

(56) References Cited

U.S. PATENT DOCUMENTS

| | | |
|---|---|---|
| 2014/0242769 A1 | 8/2014 | Yamada et al. |
| 2016/0293692 A1* | 10/2016 | Sakata ................ H01L 29/7811 |
| 2017/0084693 A1 | 3/2017 | Hoki |
| 2017/0154984 A1 | 6/2017 | Eguchi et al. |

OTHER PUBLICATIONS

Search Report in NL Application No. 2022242, dated Sep. 25, 2019, 11pp.

* cited by examiner

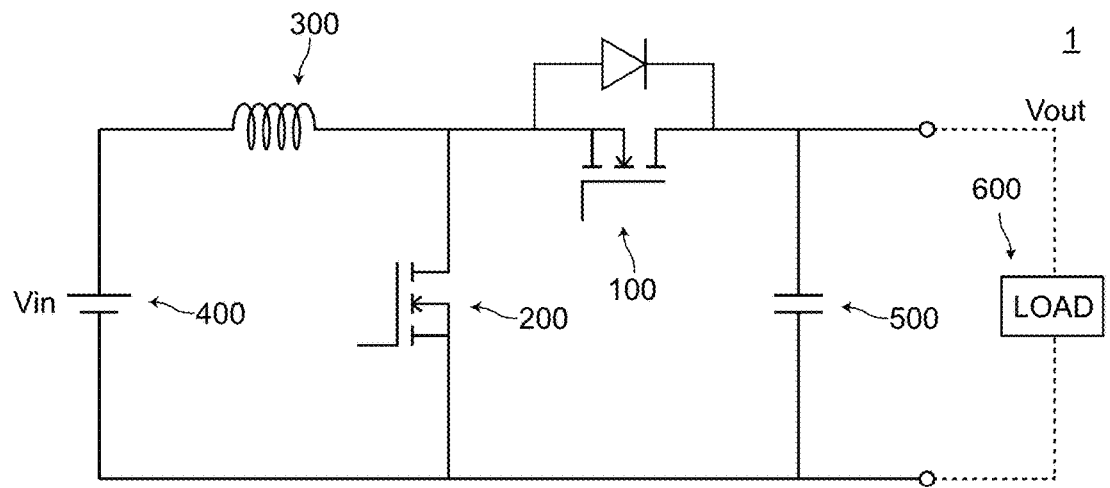
FIG.1
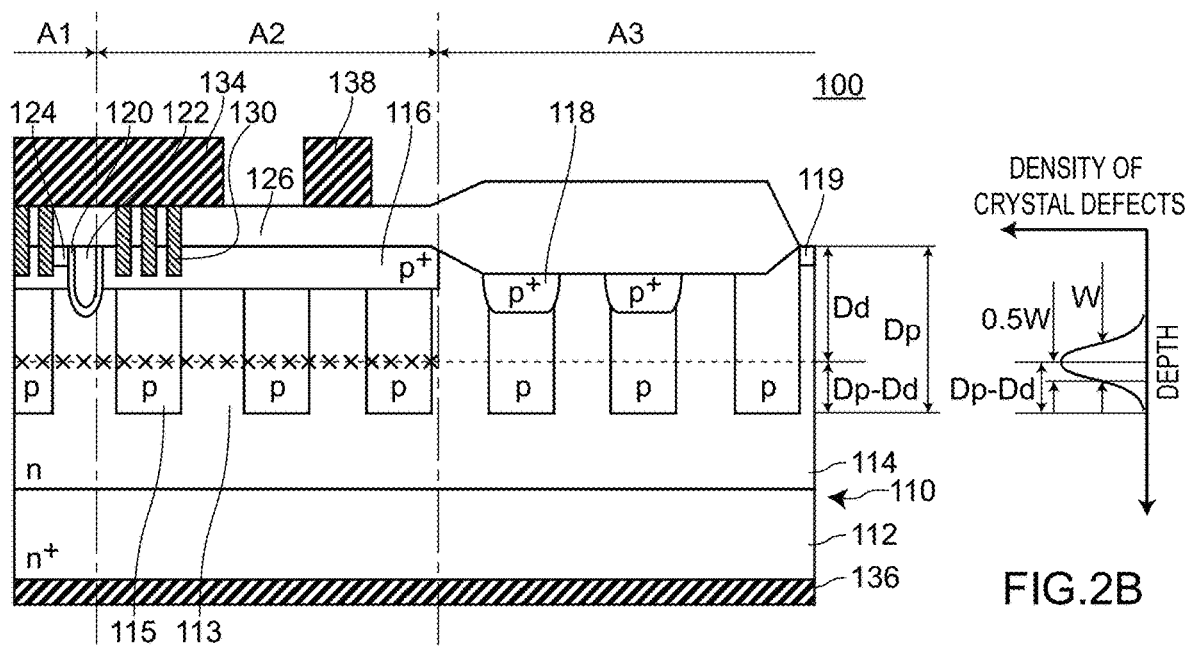
FIG.2A
FIG.2B

【FIG.14】
PRIOR ART
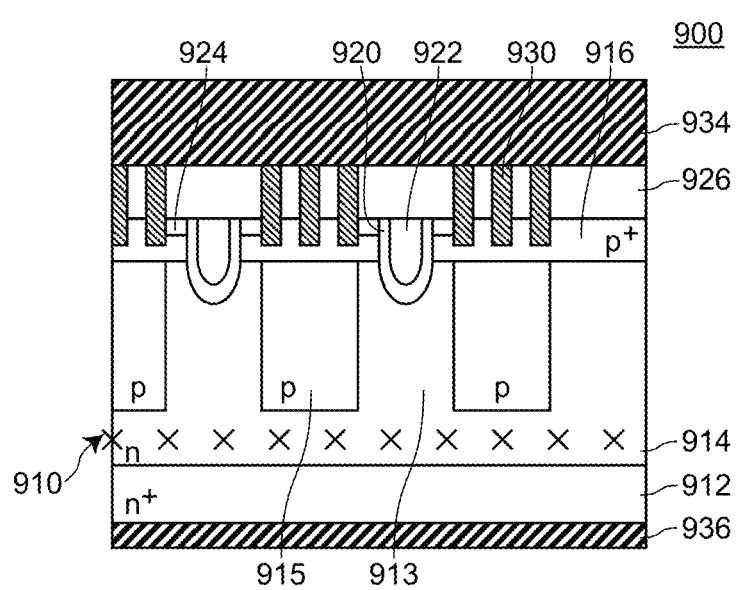

MOSFET, HAVING A SEMICONDUCTOR
BASE SUBSTRATE WITH A SUPER
JUNCTION STRUCTURE, METHOD OF
MANUFACTURING THE MOSFET, AND
POWER CONVERSION CIRCUIT HAVING
THE MOSFET

RELATED APPLICATIONS

The present application is a National Phase of International Application Number PCT/JP2017/047082, filed Dec. 27, 2017.

TECHNICAL FIELD

The present invention relates to a MOSFET, a method of manufacturing a MOSFET, and a power conversion circuit.

BACKGROUND ART

Conventionally, with respect to a MOSFET which uses a super junction structure, there has been known a MOSFET where crystal defects are formed (see patent literature 1, for example).

The conventional MOSFET is described by exemplifying a MOSFET 900 described hereinafter. The MOSFET 900 is exemplified for describing crystal defects and hence, in the description made hereinafter, the specific configuration which the MOSFET 900 has (for example, whether or not the MOSFET 900 is a trench-gate-type MOSFET, whether or not the MOSFET 900 includes a metal plug or the like) is not essential.

As shown in FIG. 14, the conventional MOSFET 900 includes: a semiconductor base substrate 910 which has an n-type column region 913 and a p-type column region 915 and in which a super junction structure is formed of the n-type column region 913 and the p-type column region 915; and a gate electrode 922 which is formed on a first main surface side of the semiconductor base substrate 910 byway of a gate insulation film 920.

The MOSFET 900 includes, besides the above-mentioned constitutional elements, a low-resistance semiconductor layer (drain layer) 912, a buffer layer 914, a base region 916, source regions 924, an interlayer insulation film 926, metal plugs 930, a source electrode 934, and a drain electrode 936.

The MOSFET 900 is a so-called trench-gate-type MOSFET.

FIG. 14 shows a part of a so-called active region in the conventional MOSFET 900.

In the conventional MOSFET 900, the crystal defects are formed in the semiconductor base substrate 910 (see marks x in FIG. 14). In MOSFET 900, density of crystal defects exhibits a maximum value at a depth between a deepest portion of the super junction structure and an upper surface portion of the low-resistance semiconductor layer 912 (a depth at which the buffer layer 914 exists).

With the use of the conventional MOSFET 900, carriers can be recoupled at the crystal defects (a lifetime of carriers can be controlled) at the time of reverse recovery of a body diode. As a result, the carriers can be extinguished even when the carriers do not move to an electrode. Accordingly, in the conventional MOSFET 900, a switching speed can be increased by shortening a reverse recovery time (Trr). As a result, a reverse recovery charge amount (Qrr) can be reduced thus providing a MOSFET which can reduce a recovery loss compared to a MOSFET which has a super junction structure and in which crystal defects are not formed.

In the description made hereinafter, in the case where the description "a recovery loss is reduced" is simply used, such a description means an advantageous effect obtained compared to the case where a MOSFET which has a super junction structure and in which crystal defects are not formed.

CITATION LIST

Patent Literature

PTL 1: JP 2015-135987 A

SUMMARY OF INVENTION

Technical Problem

In general, in a MOSFET having a super junction structure, a junction capacitance of the super junction structure is large and a depletion layer rapidly expands from a pn junction at the time of reverse recovery of a body diode. Accordingly, there is a tendency that a reverse recovery current (Irr) rapidly becomes small (dIr/dt being increased) after the reverse recovery current (Irr) passes a peak value (Irp). In other words, there is a tendency that a reverse recovery current (Irr) becomes a hard recovery state (see FIG. 4 described later).

On the other hand, in the case where crystal defects are formed in a semiconductor base substrate of a MOSFET, a lifetime of carriers becomes so short that there arises a case where a reverse recovery current (Irr) becomes further rapidly small after the reverse recovery current (Irr) passes a peak value (Irp). Particularly, as in the case of the conventional MOSFET 900, in the case where density of crystal defects exhibits a maximum value at a depth position deeper than a deepest portion of a super junction structure, a tendency that a reverse recovery current (Irr) becomes further rapidly small after the reverse recovery current (Irr) passes a peak value (Irp) becomes more conspicuous (see FIG. 4 described later).

When a reverse recovery current (Irr) becomes rapidly small after the reverse recovery current (Irr) passes a peak value (Irp), an induced electromotive force (V=Ls×dIr/dt) generated due to a parasitic inductance component (Ls) is increased and hence, oscillation is liable to be generated. That is, a MOSFET having a super junction structure has a drawback that oscillation is liable to be generated, and a MOSFET where crystal defects are formed (for example, a MOSFET such as the conventional MOSFET 900) has a drawback that oscillation is more liable to be generated.

The present invention has been made to overcome the above-mentioned drawbacks, and it is an object of the present invention to provide a MOSFET where recovery loss can be reduced, and oscillation is generated in a small amount compared to a conventional MOSFET (a MOSFET which has a super junction structure and in which crystal defects are formed). It is another object of the present invention to provide a method of manufacturing a MOSFET for manufacturing a MOSFET where a recovery loss can be reduced, and oscillation is generated in a small amount compared to a conventional MOSFET. It is still another object of the present invention to provide a high quality power conversion circuit which uses a MOSFET where recovery loss can be reduced, and oscillation is generated in a small amount compared to a conventional MOSFET as described above.

Solution to Problem

[1] A MOSFET according to the present invention is a MOSFET which includes:
a semiconductor base substrate having an n-type column region and a p-type column region, the n-type column region and the p-type column region forming a super junction structure; and
a gate electrode formed on a first main surface side of the semiconductor base substrate by way of a gate insulation film, wherein
assuming a region of the semiconductor base substrate which provides a main operation of the MOSFET as an active region, a region of the semiconductor base substrate disposed on an outer peripheral side of the active region and maintaining a withstand voltage of the MOSFET as an outer peripheral region, and a region of the semiconductor base substrate disposed between the active region and the outer peripheral region as an active connecting region,
out of the active region, the active connecting region, and the outer peripheral region of the semiconductor base substrate, crystal defects are formed only in the active region and the active connecting region.

[2] In the MOSFET according to the present invention, it is preferable that the semiconductor base substrate further include:
a base region of a first conductive type formed on the first main surface side of the n-type column region and the first main surface side of the p-type column region; and
a source region of a second conductive type formed on a first main surface side of the base region and being in contact with the gate insulation film,
the MOSFET further comprise:
an interlayer insulation film formed so as to cover the base region, the gate insulation film, the gate electrode, and the source region; and
a source electrode formed on a surface of the interlayer insulation film and electrically connected with the base region and the source region, and
in a cross section of the semiconductor base substrate parallel to a depth direction of the semiconductor base substrate,
an outer end of an outermost portion which is formed of either one of the source region and the gate electrode capable of providing a main operation as the MOSFET form a boundary between the active region and the active connecting region, and
an outer end of the base region form a boundary between the active connecting region and the outer peripheral region.

[3] In the MOSFET according to the present invention, it is preferable that, as viewed in a plan view of the semiconductor base substrate, assuming a total area of the active region as S1, a total area of the active connecting region as S2, and a total area of the outer peripheral region as S3, and assuming a withstand voltage of the MOSFET as VDSS, a relationship of $S3>(S1+S2+S3)\times 0.05\times(VDSS/600)$ be satisfied.

[4] In the MOSFET according to the present invention, it is preferable that the crystal defects be formed such that density of the crystal defects is locally increased as viewed along a depth direction.

[5] In the MOSFET according to the present invention, it is preferable that, using the first main surface of the semiconductor base substrate in the active region as a reference and assuming a depth to a deepest portion of the super junction structure as Dp, a depth at which density of the crystal defects exhibits a maximum value as Dd, and a half value width of density distribution of the crystal defects as W, a relationship of $0.25Dp \leq Dd \leq 1.1Dp$ and a relationship of $0.05Dp<W<0.5Dp$ be satisfied.

[6] A method of manufacturing a MOSFET according to the present invention includes in a following order:
a preparation step where a predetermined structural body is prepared, the predetermined structural body including: a semiconductor base substrate having an n-type column region and a p-type column region, the n-type column region and the p-type column region forming a super junction structure; and a gate electrode formed on a first main surface side of the semiconductor base substrate by way of a gate insulation film; and
a crystal defect forming step where crystal defects are formed in the semiconductor base substrate, wherein
assuming a region of the semiconductor base substrate which provides a main operation of the MOSFET when the semiconductor base substrate is completed as the MOSFET as an active region, a region of the semiconductor base substrate disposed on an outer peripheral side of the active region and maintaining a withstand voltage of the MOSFET as an outer peripheral region, and a region of the semiconductor base substrate disposed between the active region and the outer peripheral region as an active connecting region,
in the crystal defect forming step, out of the active region, the active connecting region, and the outer peripheral region of the semiconductor base substrate, the crystal defects are formed only in the active region and the active connecting region.

[7] In the method of manufacturing a MOSFET according to the present invention, it is preferable that the semiconductor base substrate of the predetermined structural body prepared in the preparation step further include:
a base region of a first conductive type formed on the first main surface side of the n-type column region and the first main surface side of the p-type column region; and
a source region of a second conductive type formed on a first main surface side of the base region and being in contact with the gate insulation film,
the predetermined structural body prepared in the preparation step further includes:
an interlayer insulation film formed so as to cover the base region, the gate insulation film, the gate electrode, and the source region; and
a source electrode formed on a surface of the interlayer insulation film and electrically connected with the base region and the source region, and
in the crystal defect forming step, crystal defects be formed in a state where, in a cross section of the semiconductor base substrate parallel to a depth direction of the semiconductor base substrate, an outer end of an outermost portion which is formed of either one of the source region and the gate electrode capable of providing a main operation as the MOSFET forms a boundary between the active region and the active connecting region, and an outer end of the base region forms a boundary between the active connecting region and the outer peripheral region.

[8] In the method of manufacturing a MOSFET according to the present invention, it is preferable that, in the preparation step, as viewed in a plan view of the semiconductor base substrate, assuming a total area of the active region as S1, a total area of the active connecting region as S2, and a total area of the outer peripheral region as S3, and assuming a withstand voltage of the MOSFET to be manufactured as VDSS, a predetermined structural body which satisfies a relationship of S3>(S1+S2+S3)×0.05× (VDSS/600) be satisfied is prepared as the predetermined structural body.

[9] In the method of manufacturing a MOSFET according to the present invention, it is preferable that, in the crystal defect forming step, the crystal defects be formed such that density of the crystal defects is locally increased as viewed along a depth direction.

[10] In the method of manufacturing a MOSFET according to the present invention, it is preferable that, in the crystal defect forming step, the crystal defects are formed such that, using the first main surface of the semiconductor base substrate in the active region as a reference and assuming a depth to a deepest portion of the super junction structure as Dp, a depth at which density of the crystal defects exhibits a maximum value as Dd, and a half value width of density distribution of the crystal defects as W, a relationship of 0.25Dp≤Dd≤1.1Dp and a relationship of 0.05Dp<W<0.5Dp be satisfied.

[11] In the method of manufacturing a MOSFET according to the present invention, it is preferable that, in the crystal defect forming step, the crystal defects be formed by He irradiation or by proton irradiation.

[12] A power conversion circuit according to the present invention includes:
a MOSFET used for making a forward current flow into a body diode;
a switching element; and
an inductive load, wherein
the MOSFET includes:
a semiconductor base substrate having an n-type column region and a p-type column region, the n-type column region and the p-type column region forming a super junction structure; and
a gate electrode formed on a first main surface side of the semiconductor base substrate by way of a gate insulation film, wherein
assuming a region of the semiconductor base substrate which provides a main operation of the MOSFET as an active region, a region of the semiconductor base substrate disposed on an outer peripheral side of the active region and maintaining a withstand voltage of the MOSFET as an outer peripheral region, and a region of the semiconductor base substrate disposed between the active region and the outer peripheral region as an active connecting region,
out of the active region, the active connecting region, and the outer peripheral region of the semiconductor base substrate, the crystal defects are formed only in the active region and the active connecting region.

Advantageous Effects of Invention

According to the MOSFET of the present invention, crystal defects are formed in the semiconductor base substrate. Accordingly, in the same manner as the conventional MOSFET, carriers can be recoupled at the crystal defects (a lifetime of carriers can be controlled) at the time of reverse recovery of a body diode. As a result, the carriers can be extinguished even when the carriers do not move to an electrode. Accordingly, in the MOSFET of the present invention, a switching speed can be increased by shortening a reverse recovery time (Trr). As a result, a reverse recovery charge amount (Qrr) can be reduced thus providing a MOSFET which can reduce a recovery loss.

In the MOSFET according to the present invention, out of the active region, the active connecting region, and the outer peripheral region of the semiconductor base substrate, the crystal defects are formed only in the active region and the active connecting region. That is, crystal defects are not formed in the outer peripheral region. Accordingly, at the time of reverse recovery of the body diode, carriers in the outer peripheral region are minimally recoupled and hence, in the outer peripheral region, carriers are moved to the electrode and then are drawn out.

Accordingly, in the MOSFET of the present invention, timing that carriers in the outer peripheral region are extinguished is delayed compared to timing that carriers in the active region and the active connecting region are extinguished (see FIG. 5 described later) and hence, because of an effect of the carriers remaining in the outer peripheral region, a reverse recovery current (Irr) is gradually decreased. In other words, a recovery waveform can be softened.

As a result, according to the MOSFET of the present invention, it is possible to prevent the occurrence of a phenomenon that a reverse recovery current (Irr) becomes rapidly small (dIr/dt becoming large) after the reverse recovery current (Irr) passes a peak value (Irp). Accordingly, it is possible to suppress the increase of an induced electromotive force generated by a parasitic inductance component.

That is, the MOSFET according to the present invention becomes a MOSFET where oscillation is generated in a small amount compared to conventional MOSFETs.

Accordingly, the MOSFET according to the present invention becomes a MOSFET which can reduce a recovery loss and in which oscillation is generated in a small amount compared to conventional MOSFETs.

The method of manufacturing a MOSFET according to the present invention includes the crystal defect forming step where crystal defects are formed in the semiconductor base substrate, and in the crystal defect forming step, out of the active region, the active connecting region, and the outer peripheral region of the semiconductor base substrate, the crystal defects are formed only in the active region and the active connecting region. Accordingly, as described above, it is possible to manufacture a MOSFET which can reduce a recovery loss and in which oscillation is generated in a small amount compared to conventional MOSFETs.

The power conversion circuit according to the present invention includes the MOSFET (the MOSFET according to the present invention) where, out of the active region, the active connecting region, and the outer peripheral region of the semiconductor base substrate, the crystal defects are formed only in the active region and the active connecting region. Accordingly, as described above, it is possible to provide a high quality power conversion circuit using the MOSFET which can reduce a recovery loss and in which oscillation is generated in a small amount compared to conventional MOSFETs.

BRIEF DESCRIPTION OF DRAWINGS

FIG. 1 is a circuit diagram showing a power conversion circuit 1 according to an embodiment.

FIGS. 2A and 2B are views for describing a MOSFET 100 according to the embodiment. FIG. 2A is a cross-sectional view showing a portion of the MOSFET 100 (the portion including an active region A1, an active connecting region A2, and an outer peripheral region A3 substantially corresponding to a cross section taken along S-S shown in FIG. 3 described later, hereinafter, the same definition being applicable when "a portion of the MOSFET" is simply referred), and FIG. 2B is a graph showing the distribution of crystal defects in the MOSFET 100. FIG. 2A is a cross-sectional view showing a portion of the MOSFET 100 and hence, both left and right ends of FIG. 2A do not always indicate terminal ends of the MOSFET 100 (the same understanding being applicable to FIGS. 8A and 8B to FIG. 13 described later). An axis of ordinates of a graph shown in FIG. 2B indicates a depth using a first main surface of a semiconductor base substrate 110 as a reference, and an axis of abscissas of the graph indicates density of crystal defects. In FIG. 2A, a broken line which connects marks×(marks schematically showing a position where density of crystal defects is high) is an auxiliary line for facilitating understanding of a depth Dp at which density of crystal defects exhibits a maximum value visually. In FIG. 2A, a chain line is an auxiliary line indicating a boundary between the active region A1 and the active connecting region A2 or a boundary between the active connecting region A2 and the outer peripheral region A3. A graph in FIG. 2B schematically indicates the density distribution of crystal defects, and an axis of ordinates and an axis of abscissas of the graph do not indicate specific numerical values. However, FIG. 2A and FIG. 2B correspond to each other in a depth direction of the semiconductor base substrate 110.

In FIG. 3, for facilitating the understanding of the distribution of the active region A1, the active connecting region A2, and the outer peripheral region A3, specific constitutional elements and the like except for the respective regions are not shown in the drawing. FIG. 3 is a schematic view and hence, shapes and an area ratio of the active region A1, the active connecting region A2, and the outer peripheral region A3 shown in FIG. 3 are not accurate. In FIG. 3, a region indicated by symbol G is a region where a gate pad is disposed.

FIG. 6 is provided for describing a positional relationship between the depth Dd at which density of crystal defects exhibits a maximum value and a region C where a carrier pool is liable to be formed. That is, FIG. 6 does not indicate that two depths at which density of crystal defects exhibits a maximum value exist in the MOSFET 190.

FIG. 7A to FIG. 7E show the formation of the carrier pool performed in this order along with a lapse of time. The region shown in FIGS. 7A to 7E is a region corresponds to the region indicated by symbol A in FIG. 6. However, FIG. 6 is a schematic view (a view where sizes and a ratio of the described structure are not accurate since priority is assigned to facilitating understanding) and hence, the structure shown in FIG. 6 and the structure shown in FIGS. 7A to 7E do not agree with each other strictly. In the simulation shown in FIGS. 7A to 7E, a metal plug which is not an indispensable element is not taken into consideration in the present invention. FIGS. 7A to 7E are views obtained based on a result of a simulation performed under conditions considered appropriate. Accordingly, although FIGS. 7A to 7E are not directly applicable to all MOSFETs, MOSFETs which use a super junction structure exhibit substantially the same tendency as the MOSFET shown in FIGS. 7A to 7E.

FIG. 8A and FIG. 8B are step views respectively.

FIG. 9A and FIG. 9B are step views respectively.

FIG. 14 is a cross-sectional view showing a configuration of an active region of a conventional MOSFET 900.

DESCRIPTION OF EMBODIMENTS

Figure 3:
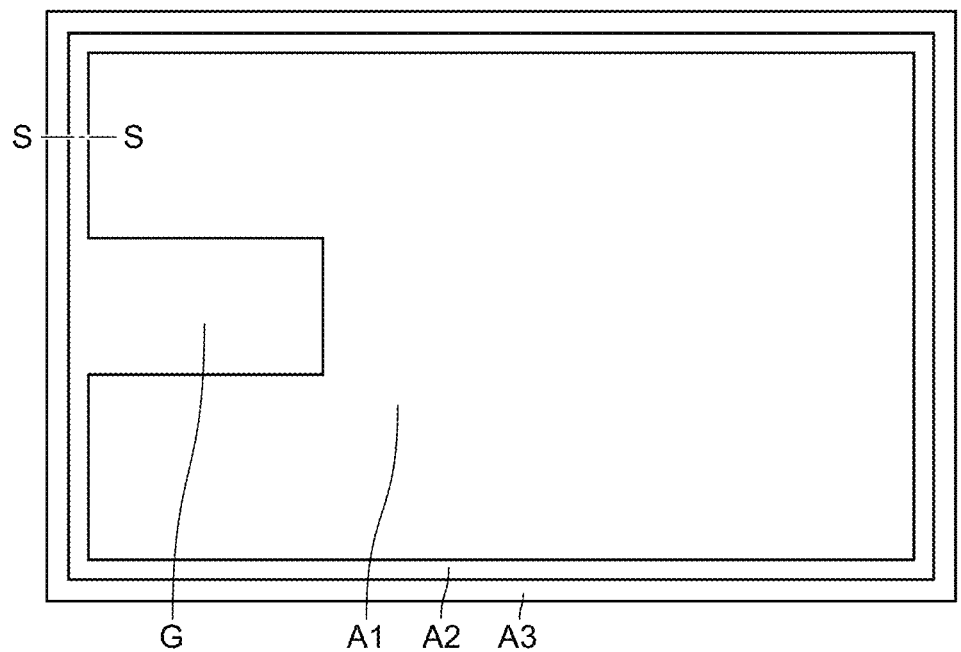
FIG. 3 is a plan view (top plan view) of the semiconductor base substrate 110 according to the embodiment.

Hereinafter, a MOSFET, a method of manufacturing a MOSFET, and a power conversion circuit according to the present invention are described in accordance with embodiment shown in the drawings. The respective drawings are schematic drawings, and do not always strictly reflect actual structures and actual configurations. The embodiment and modifications described hereinafter are not intended to limit the invention relating to Claims. Further, it is not always a case that all of various elements described in the embodiment and the modifications and combinations of these elements are indispensable as means for solving problems of the present invention. In the embodiment and the modifications, constitutional elements basically having the same configurations and technical features (including constitutional elements which are not completely identical with respect to shapes, constitutions or the like) are indicated by using the same symbols, and the repeated description of these constitutional elements may be omitted.

Embodiment

1. Configuration of Power Conversion Circuit 1

Firstly, the power conversion circuit 1 according to the embodiment is described.

The power conversion circuit 1 according to the embodiment is a chopper circuit (step-up chopper circuit) which is a constitutional element of a DC-DC converter, an inverter or the like. As shown in FIG. 1, the power conversion circuit 1 according to the embodiment includes: a MOSFET 100 used for making a forward current flow in a body diode; a switching element 200; an inductive load (reactor) 300; a power source 400; and a smoothing capacitor 500. A load 600 is connected to external terminals of the power conversion circuit 1.

The MOSFET 100 in the power conversion circuit 1 is a MOSFET 100 according to the embodiment described later. The MOSFET 100 performs a rectifying operation of a current which the power source 400 supplies to the inductive load 300 when a voltage is not applied to a gate electrode 122 (described later) (the MOSFET 100 being in an OFF state). That is, the MOSFET 100 in a state where a voltage is not applied to the gate electrode 122 can be treated as a so-called freewheel diode.

The switching element 200 controls an electric current which the power source 400 supplies to the inductive load 300 and an electric current supplied from the power source 400. The switching element 200 in this embodiment is a MOSFET (a MOSFET different from the MOSFET 100 according to the embodiment).

The switching element 200 is switched in response to a clock signal applied to a gate electrode of the switching element 200 from a drive circuit (not shown in the drawing), and when the switching element 200 is brought into an ON state, the inductive load 300 and the power source 400 become conductive with each other.

The inductive load 300 is a passive element (inductor) which can store energy in a magnetic field formed by a current.

A positive pole of the power source 400 is electrically connected with one end of the inductive load 300, and a negative pole of the power source 400 is electrically connected to a source electrode of the switching element 200. A drain electrode of the switching element 200 is electrically connected with the other end of the inductive load 300 and a source electrode 134 (described later) which corresponds to an anode electrode in a body diode of the MOSFET 100.

2. Configuration of MOSFET 100

Next, the MOSFET 100 according to the embodiment is described.

In the description made hereinafter, assume a region of the semiconductor base substrate 110 (described later) which provides a main operation of the MOSFET 100 as an active region A1, a region of the semiconductor base substrate 110 disposed on an outer peripheral side of the active region A1 and maintaining a withstand voltage of the MOSFET 100 as an outer peripheral region A3, and a region of the semiconductor base substrate 110 disposed between the active region A1 and the outer peripheral region A3 as an active connecting region A2 (see FIG. 3 described later).

"a region which provides a main operation of the MOSFET" means a region which includes constitutional elements which operate as the MOSFET (capable of performing a current control).

As shown in FIG. 2A, the MOSFET 100 according to the embodiment includes: a semiconductor base substrate 110 which has n-type column regions 113 and p-type column regions 115 and in which a super junction structure is formed of the n-type column regions 113 and the p-type column regions 115; and a gate electrode 122 which is formed on a first main surface side of the semiconductor base substrate 110 by way of a gate insulation film 120.

The MOSFET 100 according to the embodiment is a so-called trench-gate-type MOSFET.

A withstand voltage of the MOSFET 100 is 300 V or more, and is 600 V, for example. In this specification, "withstand voltage" of the MOSFET means "drain-source withstand voltage".

In this specification, "super junction structure" means a structure where the n-type column region and the p-type column region are arranged alternately in a repeated manner as viewed on a predetermined cross section (for example, a cross section perpendicular to a first main surface and also perpendicular to a trench forming direction).

The semiconductor base substrate 110 according to the embodiment further includes, besides the n-type column regions 113 and the p-type column regions 115, a low-resistance semiconductor layer 112, a buffer layer 114, a base region 116, a source region 124, guard rings 118, and a channel stopper 119.

The MOSFET 100 according to the embodiment further includes, besides the semiconductor base substrate 110 and the gate electrode 122, an interlayer insulation film 126, metal plugs 130, a source electrode 134, a drain electrode 136, and a gate line 138.

In this specification, "first main surface" means a surface of the semiconductor base substrate (portion formed of a continuous semiconductor) on a side where the main structure (gate electrode and the like) exists. In the MOSFET 100, a boundary surface between the base region 116 and the interlayer insulation film 126 forms the first main surface.

All of the above-mentioned constitutional elements of the semiconductor base substrate 110 and the MOSFET 100 are known elements and hence, the basic matters are described in the description made hereinafter.

The low-resistance semiconductor layer 112 is of an n⁺-type. A thickness of the low-resistance semiconductor layer 112 falls within a range of 100 μm to 400 μm inclusive, for example. Dopant concentration of the low-resistance semiconductor layer falls within a range of $1\times10^{19}$ cm$^{-3}$ to $1\times10^{20}$ cm$^{-3}$, for example.

The n-type column regions 113 and the p-type column regions 115 have substantially the same cross-sectional shape respectively, and are arranged at an equal interval. So long as advantageous effects brought about by the super junction structure can be obtained, the n-type column regions and the p-type column regions may not have substantially the same cross-sectional shape, and may not arranged at an equal interval.

Dopant concentration in the n-type column regions 113 and dopant concentration in the p-type column regions 115 fall within a range of $5\times10^{13}$ cm$^{-3}$ to $1\times10^{16}$ cm$^{-3}$, for example. So long as advantageous effects brought about by the super junction structure can be obtained, a total amount of dopant in the n-type column regions 113 and a total amount of dopant in the p-type column regions 115 may be set equal to each other or may be set different from each other.

In the MOSFET 100, the n-type column regions 113 and the buffer layer 114 are integrally formed thus forming an n-type semiconductor layer. A thickness of the n-type semiconductor layer falls within a range of 5 μm to 120 μm, for example.

The base region 116 is a region of a first conductive type which is formed on a first main surface side of the n-type column regions 113 and a first main surface side of the p-type column regions 115. To be more specific, the base region 116 is a region of a p⁺-type. In the MOSFET 100 according to the embodiment, the first conductive type means the p-type (concentration being arbitrarily set).

Using the first main surface of the semiconductor base substrate 110 in the active region A1 as a reference, a depth position of a deepest portion of the base region 116 falls within a range of 0.5 μm to 4.0 μm, for example. Dopant concentration of the base region 116 falls within a range of $5\times10^{16}$ cm$^{-3}$ to $1\times10^{18}$ cm$^{-3}$, for example.

The guard ring 118 has the structure for increasing a withstand voltage of the MOSFET 100. With the use of the guard ring 118, a depletion layer which expands from a pn junction at a reverse bias time expands to an outer peripheral region thus increasing a withstand voltage. In this embodiment, the guard rings 118 are a region of a first conductive type which is formed so as to surround the active region A1 and the active connecting region A2 in the outer peripheral region A3. To be more specific, the guard ring 118 is a region of a p⁺-type.

The active region A1, the active connecting region A2, and the outer peripheral region A3 in this embodiment are described later.

The channel stopper 119 is a structure for suppressing the expansion of the depletion layer at a reverse bias time. In this embodiment, the channel stopper 119 is a region of a second conductive type formed so as to surround the guard rings 118 in the outer peripheral region A3. To be more specific, the channel stopper 119 is a region of an n⁺-type.

A trench (not indicated by a symbol in the drawings) is formed in the base region 116 in a penetrating manner to a depth position which reaches the n-type column region 113, and the gate electrode 122 is formed on an inner peripheral surface of the trench in an embedded manner by way of a gate insulation film 120.

A depth of the trench is 3 μm, for example.

The gate insulation film 120 is formed of a silicon dioxide film formed by a thermal oxidation method, for example. A thickness of the gate insulation film 120 is 100 nm, for example.

The gate electrode 122 is made of low-resistance polysilicon formed by a CVD method or an ion implantation method.

The source region 124 is formed on a first main surface side of the base region 116 and is in contact with the gate insulation film 120. That is, the source region 124 is a region of a second conductive type where a part of the source region 124 is exposed on the inner peripheral surface of the trench. To be more specific, the source region 124 is a region of n⁺-type. In the MOSFET 100 of this embodiment, "second conductive type" is an n-type (concentration being arbitrarily set).

Using a first main surface of the semiconductor base substrate 110 in the active region A1 as a reference, a depth position of a deepest portion of the source region 124 can be set to a value which falls within a range of 0.1 μm to 0.4 μm, for example. Dopant concentration in the source region 124 falls within a range of $5\times10^{19}$ cm$^{-3}$ to $2\times10^{20}$ cm$^{-3}$, for example.

The interlayer insulation film 126 is formed so as to cover the base region 116, the gate insulation film 120, the gate electrode 122, and the source region 124. The interlayer insulation film 126 is formed of a PSG film formed by a CVD method and having a thickness of 1000 nm, for example, in the active region A1.

The insulation film in the outer peripheral region A3 has the structure where the interlayer insulation film 126 gets over a field insulation film (not indicated by a symbol in the drawings) formed on a surface of the semiconductor base substrate 110. With such a structure, a thickness of the insulation film in the outer peripheral region A3 becomes a sum of a thickness of the field insulation film and a thickness of the interlayer insulation film 126. That is, the insulation film is formed with a large thickness in the outer peripheral region A3 compared to the active region A1.

The field insulation film is an oxide film having a thickness of approximately 500 nm to 1000 nm. The field insulation film can be formed by thermal oxidation, for example.

In the MOSFET 100, an end portion of the field insulation film is substantially aligned with a boundary between the active connecting region A2 and the outer peripheral region A3.

In a cross-sectional view which describes the outer peripheral region of the MOSFET such as FIGS. 2A and 2B, the boundary between the interlayer insulation film and the field insulation film is not described.

The metal plugs 130 are formed by filling predetermined metal in contact holes (not indicated by a symbol in the drawings) which penetrate the interlayer insulation film 126 and reach the base region 116. A p⁺⁺-type diffusion region having higher dopant concentration than the base region 116 may be formed on a bottom surface of the metal plug 130.

A stripe width of the contact hole or the metal plug 130 is 0.5 μm, for example. A barrier metal (not shown in the drawings) is formed on an inner surface of the contact hole. The metal plug 130 is formed by filling tungsten, for example, in the contact hole by way of the barrier metal.

The source electrode 134 is formed on a surface of the interlayer insulation film 126, and is electrically connected with the base region 116 and the source region 124 via the metal plugs 130. The source electrode 134 is formed by a sputtering method. A thickness of the source electrode 134 is 4 µm, for example. The source electrode 134 is made of aluminum-based metal (an Al—Cu-based alloy, for example).

The drain electrode 136 is formed on a surface of the low-resistance semiconductor layer 112 (a back surface of the low-resistance semiconductor layer 112 in a case where a surface on a side where the source electrode 134 is formed as a front surface). The drain electrode 136 is formed of a multilayered metal film such as a Ti—Ni—Au layer. A total thickness of the multilayered metal film is 0.5 µm, for example.

The gate line 138 is a line electrically connected to the gate electrode 122 and is made of metal. The gate line 138 is connected to a gate pad (not shown in the drawings) which forms a contact between the MOSFET 100 and the outside. The gate line 138 and the gate pad are disposed in the active connecting region A2. It is unnecessary that the gate line 138 is disposed so as to surround the whole active region A1. The gate line may be also referred to as a gate finger.

In the MOSFET 100 according to the embodiment, in a cross section of the semiconductor base substrate 110 parallel to a depth direction of the semiconductor base substrate 110, an outer end of an outermost portion which is formed of either one of the source region 124 and the gate electrode 122 (the gate electrode 122 shown in FIG. 2A in the embodiment) which are capable of providing a main operation as the MOSFET 100 forms a boundary between the active region A1 and the active connecting region A2, and an outer end of the base region 116 forms a boundary between the active connecting region A2 and the outer peripheral region A3.

In this specification, "the source region and the gate electrode capable of providing a main operation of the MOSFET" means the source region and the gate electrode which are brought into contact with each other by way of the gate insulation film. For example, the gate electrode which is not brought into contact with the source region by way of the gate insulation film is not the gate electrode capable of providing a main operation of the MOSFET and hence, a region where such a gate electrode exists is not included in the active region. However, in the cross section of the semiconductor base substrate parallel to a depth direction of the semiconductor base substrate, in the case where the source region exists only one side of the trench, for the sake of convenience, it is assumed that the whole gate electrode in the cross section is included in the active region (see FIG. 2A)

In the MOSFET 100, out of the active region A1, the active connecting region A2, and the outer peripheral region A3 of the semiconductor base substrate 110, crystal defects are formed only in the active region A1 and the active connecting region A2. That is, in the MOSFET 100, crystal defects are not formed in the outer peripheral region A3.

The reason that such a configuration is adopted is described later.

FIG. 3 shows the semiconductor base substrate 110 of the MOSFET 100 as viewed in a plan view. In a plan view of the semiconductor base substrate 110, assuming a total area of the active region A1 as S1, a total area of the active connecting region A2 as S2, and a total area of the outer peripheral region A3 as S3, and assuming a withstand voltage of the MOSFET 100 as VDSS, a relationship of $S3 > (S1+S2+S3) \times 0.05 \times (VDSS/600)$ is satisfied.

The respective drawings which show the configuration of the MOSFET are schematic views and hence, setting of numerical values relating to S1, S2, and S3 and the description of FIG. 3 do not accurately correspond to each other.

In the MOSFET 100, crystal defects are formed such that density of the crystal defects is locally increased as viewed along a depth direction (see FIG. 2B.)

In the MOSFET 100, using the first main surface of the semiconductor base substrate 110 in the active region A1 as a reference and assuming a depth to a deepest portion of the super junction structure as Dp, a depth at which density of crystal defects exhibits a maximum value (see marks x in FIG. 2A) as Dd, and a half value width of density distribution of crystal defects as W, a relationship of $0.25Dp \leq Dd \leq 1.1Dp$ and a relationship of $0.05Dp < W < 0.5Dp$ are satisfied (see FIG. 2A and FIG. 2B).

The reason that the relationship of $0.25Dp \leq Dd \leq 1.1Dp$ is set is described hereinafter.

The reason that the relationship of $W < 0.5Dp$ is set is as follows. When the distribution of crystal defects is large, carriers are recoupled over a wide range formed of the p-type column regions and the n-type column regions (also including the buffer layer when the buffer layer also exists) and hence, eventually, a reverse recovery current (Irr) becomes further rapidly small (dIr/dt being increased) after the reverse recovery current (Irr) passes a peak value (Irp).

On the other hand, the reason that the relationship of $0.05Dp < W$ is set is that when the distribution of crystal defects is excessively narrow, a region where carriers are recoupled cannot be sufficiently ensured.

In this specification, "a depth to a deepest portion of the super junction structure" means a depth to a deepest portion of a region where the n-type column regions and the p-type column regions form a super junction structure using a first main surface of the semiconductor base substrate in the active region as a reference. Accordingly, a substantial depth to the deepest portion of the super junction structure basically becomes equal to a depth to the deepest portion of the n-type column region or the p-type column region having a shallower maximum depth. As described above, in this embodiment, the depth to the deepest portion of the super junction structure is equal to the depth to the deepest portion of the p-type column region 115.

The first main surface of the semiconductor based substrate 110 forms a boundary surface between the base region 116 and the interlayer insulation film 126 and hence, the depth of the super junction structure also includes the depth of the base region 116. However, the depth of the base region is extremely shallow compared to the depth of the super junction structure in general and hence, there arises no problem even when the depth of the base region 116 is included in the depth to the deepest portion of the super junction structure.

"Crystal defects whose density is increased locally as viewed along a depth direction" are formed due to He irradiation or proton irradiation as described in a method of manufacturing a MOSFET described later.

In this specification, "irradiation" means injecting ionized He or protons (hydrogen ions) into an object (semiconductor base substrate) for forming crystal defects.

In the MOSFET 100 according to the embodiment, it is preferable that a relationship of $0.25Dp \leq Dd < 0.95Dp$ be further satisfied. It is still further preferable that a relationship of $0.4Dp \leq Dd < 0.9Dp$ be satisfied.

In the MOSFET 100 according to this embodiment, it is also preferable that a relationship of $(Dp-Dd) > 0.5W$ be satisfied.

The reason that it is preferable that the relationship of 0.25Dp≤Dd<0.95Dp be satisfied and it is further preferable that the relationship of 0.4Dp≤Dd<0.9Dp be satisfied is described hereinafter.

The reason that (Dp−Dd)>0.5W is adopted as the preferable relationship is as follows. When W which is density distribution of crystal defects is large in the case where a depth at which density of crystal defects exhibits a maximum value is deep (the case where Dp-Dd is small), a large amount of crystal defects exists at the position deeper than the super junction structure and hence, eventually, there arises a case where a reverse recovery current (Irr) becomes further rapidly small (dIr/dt being increased) when the reverse recovery current (Irr) passes a peak value (Irp).

In the embodiment, to be more specific, Dd is 0.6Dp.

In the embodiment, to be more specific, W is 0.3Dp.

In the embodiment, to be more specific, Dp−Dd is 0.4Dp, and to be more specific, 0.5W is 0.15Dp.

The respective drawings which show the configuration of the MOSFET are schematic views. Particularly, for facilitating the understanding of the structure on a first main surface side, a depth of the base region 116 with respect to a depth of the super junction structure is indicated larger than an actual depth of the base region 116. Accordingly, setting of numerical values relating to the above-mentioned Dd, W, and Dp−Dd and the indication in FIG. 2A do not accurately correspond to each other.

Hereinafter, the reason is explained why, out of the active region A1, the active connecting region A2, and the outer peripheral region A3 of the semiconductor base substrate 110, crystal defects are formed only in the active region A1 and the active connecting region A2. Also the reason why the relationship of 0.25Dp≤Dd≤1.1Dp, the relationship of 0.25Dp≤Dd<0.95Dp, and the relationship of 0.4Dp≤Dd<0.9Dp are established are explained. MOSFETs described hereinafter have basically substantially the same configuration as the MOSFET 100 according to the embodiment except for the presence or non-presence of crystal defects and the position of the crystal defects.

Figure 4:
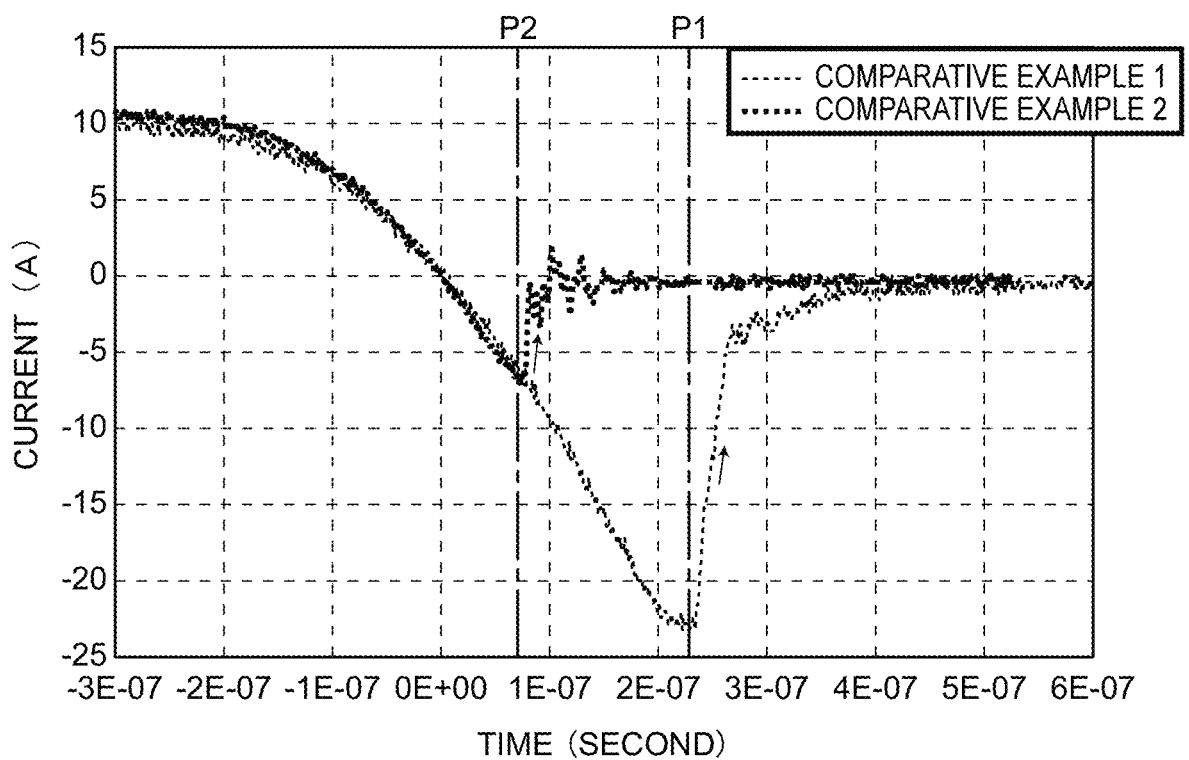
FIG. 4 is a graph for describing the difference in a reverse recovery current brought about by the presence or the non-presence of crystal defects at the time of reverse recovery of a body diode. A current (assume a positive direction as a forward direction, unit: ampere) is taken on an axis of ordinates of the graph shown in FIG. 4, and time (unit: second) is taken on an axis of abscissas of the graph. Arrows on a right side of respective graphs (waveforms) shown in FIG. 4 indicate approximate dIr/dt (approximate gradients of the graphs after a reverse recovery current passes a peak value (Irp)) of the respective graphs (waveforms). A chain line affixed with symbol P1 in FIG. 4 indicates the position of a peak value (Irp) of a reverse recovery current of a comparative example 1, and a chain line affixed with symbol P2 indicates the position of a peak value (Irp) of a reverse recovery current of a comparative example 2. The graphs shown in FIG. 4 are obtained based on actually measured values in an experiment carried out under conditions considered appropriate. Accordingly, the graphs shown in FIG. 4 are not directly applicable to all MOSFETs. However, it is considered that many MOSFETs (MOSFETs which respectively have a super junction structure and in which crystal defects are not formed and conventional MOSFETs) basically exhibit substantially the same tendency as the graphs shown in FIG. 4.

A graph of a comparative example 1 shown in FIG. 4 relates to a recovery waveform of the MOSFET which has a super junction structure and in which crystal defects are not formed. The graph of the comparative example 1 is an actually measured value of the region including all of the active region, the active connecting region, and the outer peripheral region. It is understood from the graph of the comparative example 1 that a reverse recovery current (Irr) becomes rapidly small (dIr/dt being increased) after the reverse recovery current (Irr) passes a peak value (see Irp, an intersecting point between the graph of the comparative example 1 and a chain line indicated by P1). That is, the reverse recovery current (Irr) is in a hard recovery state. Further, from the graph of the comparative example 1, it is also understood that the peak value (Irp) of the reverse recovery current is relatively large and a reverse recovery time (Trr) is relatively long and hence, a reverse recovery charge amount (Qrr) is also relatively large.

A graph of a comparative example 2 shown in FIG. 4 relates to a recovery waveform of the MOSFET which has a super junction structure and in which crystal defects are formed. The graph of the comparative example 2 is an actually measured value of the region including all of the active region, the active connecting region, and the outer peripheral region. In the MOSFET, a depth Dd at which density of crystal defects exhibits a maximum value is slightly on a first main surface side from a deepest portion of the super junction structure (between Dd=Dp and 0.95Dp and approximately 0.95Dp). Accordingly, the MOSFET is a MOSFET having the similar configuration as the previously mentioned conventional MOSFET 900.

From the graph of the comparative example 2, the following is understood. Compared to the comparative example 1, the peak value of the reverse recovery current (see Irp, an intersecting point between the graph of the comparative example 2 and a chain line indicated by P2) becomes small and a reverse recovery time (Trr) becomes short. Accordingly, although a reverse recovery charge amount (Qrr) can be largely reduced, compared to the comparative example 1, a time change rate (dIr/dt) of a reverse recovery current after the reverse recovery current passes a peak value (Irp) is increased. That is, the reverse recovery current is brought into a hard recovery. It is also understood from a waveform of the graph of the comparative example 2 that oscillation is generated.

That is, in merely forming crystal defects, there may be a case where there arises a disadvantage from a viewpoint of suppressing oscillation. In the case where a depth Dd at which density of crystal defects exhibits a maximum value is deeper than 0.95Dp (in the case of the previously mentioned conventional MOSFET 900), there is a tendency that the disadvantage is further increased from a viewpoint of suppressing oscillation.

On the other hand, in the case where the depth Dd at which density of crystal defects exhibits a maximum value is excessively shallow, significance of forming crystal defects is decreased (a moving distance until carriers are recovered is elongated so that a reverse recovery charge amount (Qrr) is not reduced so much).

Figure 5:
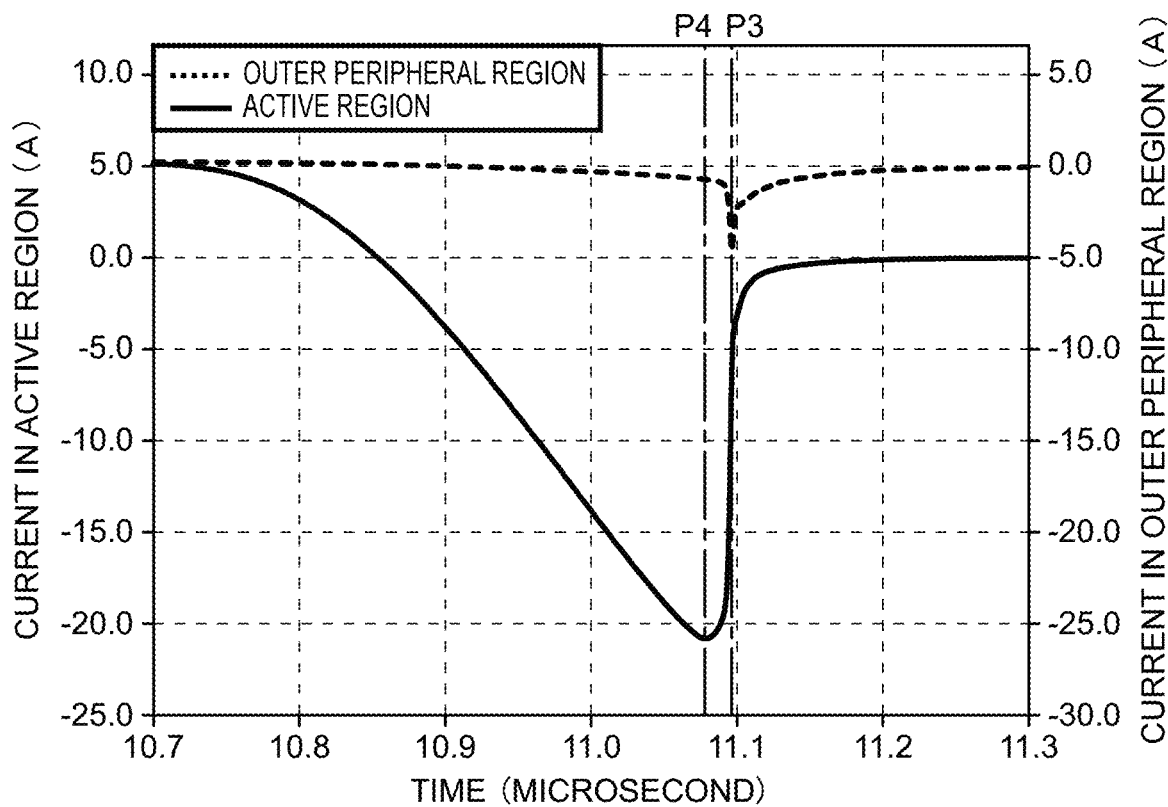
FIG. 5 is a graph for describing a difference in a reverse recovery current between the active region and the outer peripheral region at the time of reverse recovery of the body diode. A current (assume a positive direction as a forward direction, unit: ampere) is taken on an axis of ordinates of the graph shown in FIG. 5, and time (unit: microsecond) is taken on an axis of abscissas of the graph. A numerical value on the axis of ordinates of the graph on a left side indicates a value of a current with respect to a reverse recovery current in the active region, and a numerical value on the axis of ordinates of the graph on a right side indicates a value of a current with respect to a reverse recovery current in the outer peripheral region. A chain line affixed with symbol P3 in FIG. 5 indicates the position of a peak value (Irp) of a reverse recovery current in the outer peripheral region, and a chain line affixed with symbol P3 indicates the position of a peak value (Irp) of a reverse recovery current in the active region. Graphs shown in FIG. 5 are obtained based on a simulation performed under conditions considered appropriate. Accordingly, the graphs shown in FIG. 5 are not directly applicable to all MOSFETs. However, it is considered that the MOSFETs included in the present invention basically exhibit substantially the same tendency as the graphs shown in FIG. 5.

A graph of the outer peripheral region shown in FIG. 5 relates to a recovery waveform of an outer peripheral region where crystal defects are not formed. Further, a graph of an active region shown in FIG. 5 relates to a recovery waveform of an active region where crystal defects are formed in the case where a simulation is performed under the same condition as the graph of the above-mentioned outer peripheral region.

As shown in FIG. 5, a peak of a reverse recovery current in the outer peripheral region is slightly delayed compared to a peak of the reverse recovery current in the active region. This is because that, at the time of reverse recovery of the body diode, carriers in the outer peripheral region are minimally recoupled and hence, in the outer peripheral region, carriers are moved to the electrode and then are drawn out.

That is, out of the active region, the active connecting region, and the outer peripheral region of the semiconductor base substrate, the crystal defects are formed only in the active region and the active connecting region. Accordingly, timing that carriers in the outer peripheral region are extinguished is delayed compared to timing that carriers in the active region and the active connecting region are extinguished and hence, because of an effect of the carriers remaining in the outer peripheral region, a reverse recovery current (Irr) is gradually decreased. That is, a recovery waveform can be softened so that the generation of oscillations can be suppressed.

From a viewpoint of softening a recovery waveform due to the presence of the outer peripheral region where crystal defects are not formed, it is preferable that the outer peripheral region of the semiconductor base substrate have a certain amount of area. Accordingly, assuming a total area of the active region as S1, a total area of the active connecting region as S2, and a total area of the outer peripheral region as S3, and assuming a withstand voltage of the MOSFET as VDSS, it is preferable that a relationship of S3>(S1+S2+S3)×0.05×(VDSS/600) be satisfied.

Further, from a viewpoint of making a time change rate (dIr/dt) of a reverse recovery current after the reverse recovery current passes a peak value (Irp) sufficiently small and reducing a recovery loss by reducing a reverse recovery charge amount (Qrr) and of suppressing oscillation due to the configuration of the active region, it is preferable that a depth Dp to a deepest portion of the super junction structure and a depth Dd at which density of crystal defects exhibits a maximum value fall within a range of 0.25Dp≤Dd<1.1Dp. It is more preferable that the depth Dp and the depth Dd fall within a range of 0.25Dp≤Dd<0.95Dp. It is still more preferable that the depth Dp and the depth Dd fall within a range of 0.4Dp≤Dd<0.9Dp.

Hereinafter, a phenomenon is explained with reference to FIG. 6 and FIGS. 7A to 7E where a time change rate (dIr/dt) of a reverse recovery current after the reverse recovery current passes a peak value (Irp) is further rapidly increased in the case where a depth Dd at which density of crystal defects in the active region exhibits a maximum value is 0.95Dp or more, particularly, equal to or more than Dp. Assume that a MOSFET 190 and a MOSFET according to the simulation described hereinafter have basically substantially the same configuration as the MOSFET 100 according to the embodiment except for the presence or non-presence of crystal defects or the position of the crystal defects.

In a depth region between an area in the vicinity of a deepest portion of the super junction structure and an upper surface portion of the low-resistance semiconductor layer (the depth region ranging from an area in the vicinity of a bottom portion of the p-type column region to a buffer layer of an n-type), a so-called "carrier pool" is formed at the time of reverse recovery due to a reason and a mechanism described hereinafter.

Figure 6:
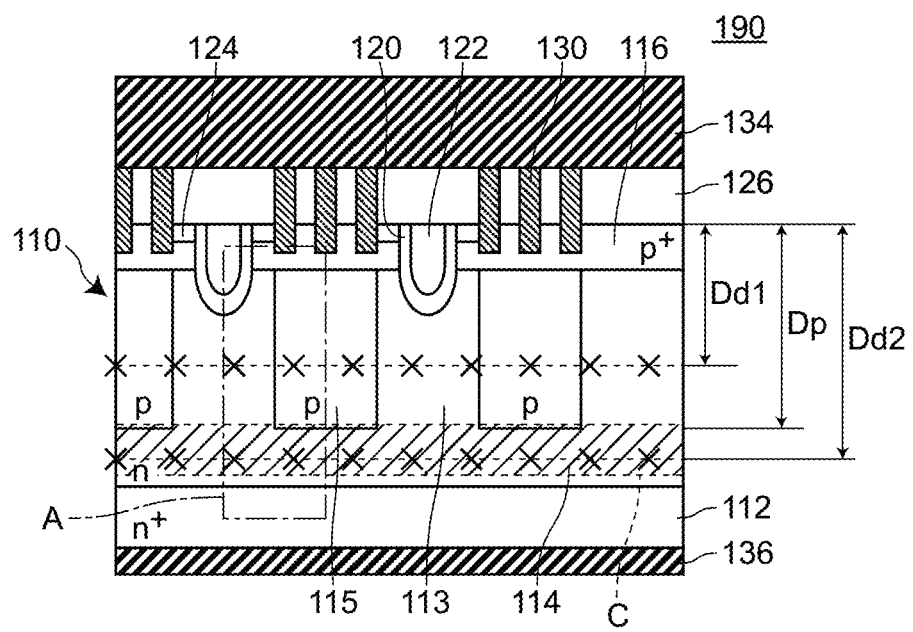
FIG. 6 is a cross-sectional view showing an active region A1 of a MOSFET 190 for describing a carrier pool in the active region. In the MOSFET 190, two depths at which density of crystal defects exhibits a maximum value are described in the MOSFET 190 (see symbol Dd1 and symbol Dd2).

The MOSFET 190 shown in FIG. 6 is provided for describing a relationship between the depth Dp at which density of crystal defects exhibits a maximum value and the carrier pool. A region indicated by a symbol C in FIG. 6 is a region where the carrier pool is liable to be formed.

The formation of the carrier pool is further described with reference to FIGS. 7a to 7E.

Figure 7A:
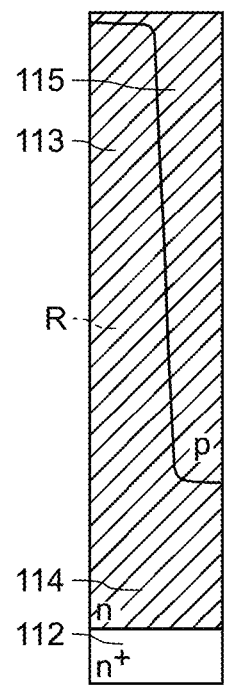
FIGS. 7A to 7E are views for describing the formation of the carrier pool in the active region. A region indicated by symbol R is a region where density of holes (electron holes) is high (density of a carrier is high)
Figure 7B:
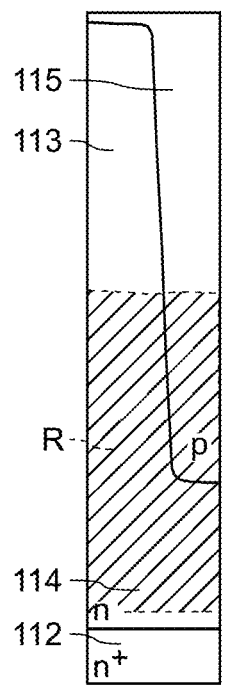
Figure 7C:
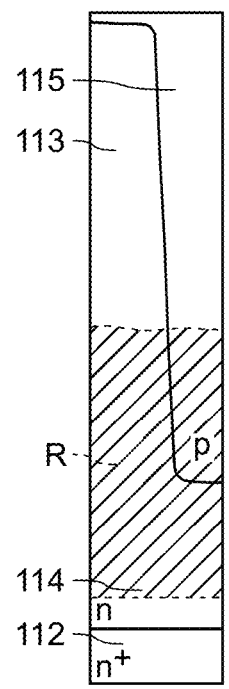
Figure 7D:
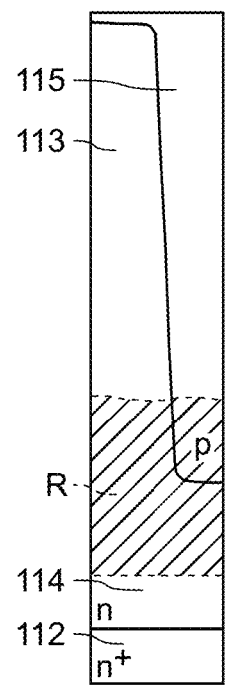
Figure 7E:
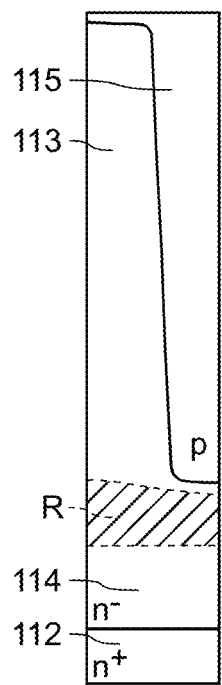

First, when a forward bias is applied to the body diode and a forward current flows in the body diode, due to conductivity modulation, electrons and holes of the same number are distributed to be filled over the whole area of the n-type column region, the p-type column region, and the buffer layer (see FIG. 7A).

Next, when the body diode enters a reverse recovery process, the holes are drawn to the first main surface side, and electrons are drawn to a side opposite to the first main surface (see FIG. 7B to FIG. 7E). In such a phenomenon, a moving speed of the holes is lower than a moving speed of electrons and hence, the holes becomes a speed limiting factor for drawing of the carriers. Since the holes are drawn from a first main surface side and hence, in a region close to a side opposite to the first main surface (relatively remote from the first main surface), that is, in a depth region between an area in the vicinity of the deepest portion of the super junction structure and an upper surface portion of the low-resistance semiconductor layer (a depth region ranging from an area in the vicinity of the bottom portion of the p-type column regions to a buffer layer of an n-type), the holes remain even at a last stage (see FIG. 7E). Further, a charge neutral condition is satisfied and hence, substantially the same number of electrons also remain in the region of substantially the same depth.

In such a process, by adopting the structure where carriers are drawn little by little from the carrier pool formed as described above, a time change rate (dIr/dt) of a reverse recovery current after the reverse recovery current passes a peak value (Irp) can be made small.

However, when the electrons and the holes remaining in the carrier pool are recoupled, a reverse recovery current (Irr) is rapidly decreased and hence, a time change rate (dIr/dt) of a reverse recovery current after the reverse recovery current passes a peak value (Irp) is increased thus generating oscillation.

Accordingly, when the depth Dd at which density of crystal defects exhibits a maximum value is large (see Dd2 in FIG. 6), recoupling of electrons and holes in the crystal defects is accelerated. Although such acceleration of recoupling is favorable for shortening a reverse recovery time (Trr), a lifetime of carriers in the carrier pool becomes excessively short and hence, a time change rate (dIr/dt) of a reverse recovery current after the reverse recovery current passes a peak value (Irp) is increased whereby oscillation is liable to be generated.

In the case where the depth Dd at which density of the crystal defects exhibits a maximum value overlaps with a region where the carrier pool is liable to be formed, a reverse recovery characteristic is strongly affected by density and the position of the crystal defects and hence, an effect attributed to irregularities in the density and the position of the crystal defects becomes conspicuous. Accordingly, in the case where the depth Dd at which density of the crystal defects exhibits a maximum value is 0.95Dp or more, particularly, in the case where the depth Dd is larger than 1.1Dp, it is considered that a reverse recovery characteristic largely changes depending on MOSFETs thus giving rise to a case where the semiconductor base substrate is not suitable for the mass production of the MOSFETs.

On the other hand, assuming the case where only the active region is taken into consideration, in the case where the depth Dd at which density of crystal defects exhibits a maximum value is set smaller than 0.95Dp, the crystal defects exist on a first main surface side of the region where a carrier pool is liable to be generated (see Dd1 in FIG. 6) and hence, there is no possibility that the crystal defects accelerate rapid recoupling of carriers remaining in the carrier pool. Accordingly, compared to the conventional MOSFET, a time until carriers existing in the vicinity of the deepest portion of the super junction structure are recoupled becomes relatively long and hence, it is possible to prevent a depletion layer from rapidly advancing from a pn junction at the time of reverse recovery of the body diode.

As a result, according to the MOSFET where the depth Dd at which density of crystal defects exhibits a maximum value is set smaller than 0.95Dp, it is possible to prevent the occurrence of a phenomenon that a reverse recovery current (Irr) becomes rapidly small (dIr/dt becoming large) after the reverse recovery current (Irr) passes a peak value (Irp). Accordingly, it is possible to suppress the increase of an induced electromotive force generated by a parasitic inductance component. As a result, the MOSFET according to this embodiment becomes a MOSFET where oscillation is generated in a small amount compared to conventional MOSFETs.

In the MOSFET according to the present invention, the outer peripheral region where crystal defects are not formed suppresses the generation of oscillations and hence, even when the depth Dd at which density of crystal defects exhibits a maximum value is equal to or more than 0.95Dp, it is possible to provide the MOSFET where oscillation is minimally generated. However, also in the MOSFET of the present invention, even when the depth Dd at which density of crystal defects exhibits a maximum value overlaps with a region where a carrier pool is liable to be formed, it is preferable that the depth Dd be disposed at a shallow position. To be more specific, it is preferable that the depth Dd at which density of crystal defects exhibits a maximum value be 1.1Dp or less.

In the case where crystal defects reach the low-resistance semiconductor layer 112 of an $n^+$-type, since the low-resistance semiconductor layer 112 is originally a region where a lifetime of carriers is short, an effect of performing a lifetime control cannot be substantially acquired whereby the formation of crystal defects has no significance. In this case, it is considered that the MOSFET has substantially the same reverse recovery characteristic as the case where crystal defects are not formed in the MOSFET.

Based on the above-mentioned findings, a reasonably derived range of Dd is set to satisfy a relationship of $0.25Dp \leq Dd \leq 1.1Dp$. A preferably reasonably derived range of Dd is set to satisfy a relationship of $0.25Dp \leq Dd < 0.95Dp$. A still more preferably reasonably derived range of Dd is set to satisfy a relationship of $0.4Dp \leq Dd < 0.9Dp$.

To describe for the confirmation purpose, it is not always the case that a MOSFET where oscillation is liable to be generated as in the case of the conventional MOSFET cannot be practically used. In consideration of the structure or usage (configuration of a circuit or the like) of the MOSFET, in the case where it is unnecessary to suppress the generation of oscillations or such necessity is low, and a reverse recovery time (Trr) and a peak current (Irp) and a reverse recovery charge (Qrr) at the time of reverse recovery are desired to be as small as possible, a MOSFET where oscillation is liable to be generated can be sufficiently practically used.

For example, in a step-up chopper of a current discontinuous type or of a current critical type, a path of a reverse recovery current of a freewheel diode passes a reactor and hence, a rapid change in a current is suppressed by the reactor. In this case, it is safe to say that necessity of suppressing the generation of oscillations is low.

3. Method of Manufacturing MOSFET

Next, a method of manufacturing a MOSFET according to the embodiment is described.

The method of manufacturing a MOSFET according to the embodiment is a method of manufacturing the MOSFET 100 according to the embodiment.

The method of manufacturing a MOSFET according to the embodiment includes in the following order: a preparation step S1; a crystal defect forming step S2; an annealing step S3; a back grinding step S4; and a drain electrode forming step S5.

Figure 8A:
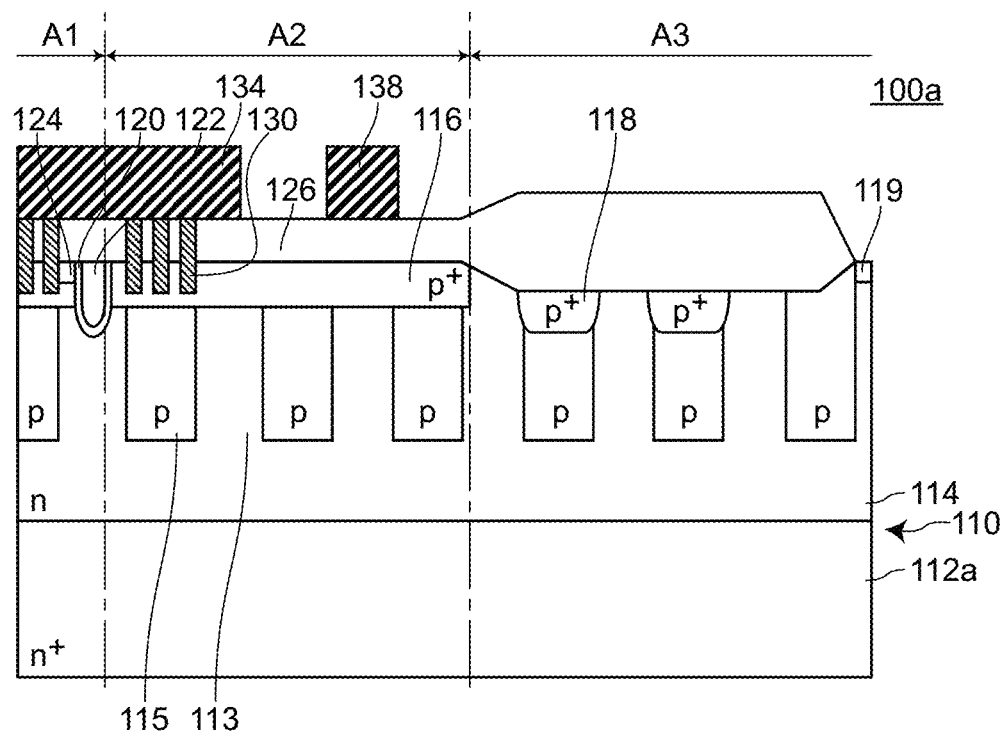
FIGS. 8A and 8B are views for describing a method of manufacturing a MOSFET according to the embodiment.

As shown in FIG. 8A, the preparation step S1 is a step in which a predetermined structural body 100a is prepared, the predetermined structural body 100a including: the semiconductor base substrate 110 which has the n-type column regions 113 and the p-type column regions 115 and in which a super junction structure is formed of the n-type column regions 113 and the p-type column regions 115; and the gate electrode 122 which is formed on the first main surface side of the semiconductor base substrate 110 byway of the gate insulation film 120.

The semiconductor base substrate 110 of the predetermined structural body 100a prepared in the preparation step S1 further includes: a portion 112a which becomes the low-resistance semiconductor layer 112; the buffer layer 114; the base region 116; the source region 124; the guard rings 118, and the channel stopper 119.

The predetermined structural body 100a prepared in the preparation step S1 further includes: the interlayer insulation film 126; the metal plugs 130; the source electrode 134; and the gate line 138.

In this specification, "predetermined structural body" means a structural body where at least crystal defects are not formed compared to the MOSFET of the present invention. The predetermined structural body may not include the constitutional elements to be provided to the MOSFET of the present invention in addition to a point that crystal defects are not formed provided that the predetermined structural body includes: a semiconductor base substrate in which a super junction structure is formed of n-type column regions and p-type column regions; and a gate electrode formed by way of a gate insulation film.

Compared to the MOSFET 100, the predetermined structural body 100a according to this embodiment does not include the drain electrode 136 in addition to the point that crystal defects are not formed. Further, the portion 112a which becomes the low-resistance semiconductor layer 112 when the predetermined structural body 100a is formed into the MOSFET 100 has a large thickness compared to the low-resistance semiconductor layer 112 of the MOSFET 100.

The semiconductor base substrate 110 of the predetermined structural body 100a prepared in the preparation step S1 differs in configuration with respect to the above-mentioned points from the semiconductor base substrate 110 in the MOSFET 100 according to the embodiment (that is, the MOSFET manufactured by the method of manufacturing a MOSFET according to the embodiment). However, both of the semiconductor base substrate 110 in the predetermined structural body 100a and the semiconductor base substrate 110 in the MOSFET 100 according to the embodiment have substantially the same main configuration and hence, identical constitutional elements are described by giving the same symbols. Hereinafter, the semiconductor base substrate of the MOSFET is described in the same manner.

The preparation step S1 can be performed by using a known step used in a method of manufacturing a known MOSFET. As an example, the predetermined structural body 100a can be prepared in accordance with the following steps in the following order consisting of: (1) a step of preparing a base substrate which becomes an origin of the semiconductor base substrate 110 (a base substrate having the n-type column regions 113 and the p-type column regions 115 capable of forming the super junction structure); (2) a step of forming the trenches for gate electrodes 122 in the base substrate; (3) a step of forming the gate insulation film 120 and the gate electrodes 122; (4) a step of forming the base region 116, the guard rings 118, and the channel stopper 119 on the base substrate; (5) a step of forming the source region 124 on the base substrate; (6) a step of forming the interlayer insulation film 126; (7) a step of forming contact holes for metal plugs 130; (8) a step of forming the metal plugs 130; and (9) a step of forming the source electrode 134. The respective steps can be performed using known methods and hence, the detailed explanation of the respective steps is omitted.

In the embodiment, the drain electrode 136 is not formed in the preparation step S1.

A thickness of the portion 112a which becomes the low-resistance semiconductor layer 112 is adjusted by grinding the semiconductor layer of an n+-type formed thicker than a required thickness by a conventional back grinding method.

Assume a region of the semiconductor base substrate 110 which provides a main operation of the MOSFET 100 when the semiconductor base substrate 110 is completed as the MOSFET 100 as the active region A1, a region of the semiconductor base substrate 110 disposed on an outer peripheral side of the active region A1 and maintaining a withstand voltage of the MOSFET 100 as the outer peripheral region A3, and a region of the semiconductor base substrate 110 disposed between the active region A1 and the outer peripheral region A3 as an active connecting region A2.

In the preparation step S1, in a plan view of the semiconductor base substrate 110, assuming a total area of the active region A1 as S1, a total area of the active connecting region A2 as S2, a total area of the outer peripheral region A3 as S3, and assuming a withstand voltage of the MOSFET 100 to be manufactured as VDSS, a predetermined structural body which satisfies a relationship of $S3>(S1+S2+S3)\times 0.05\times(VDSS/600)$ is prepared as the predetermined structural body 100a.

Figure 8B:
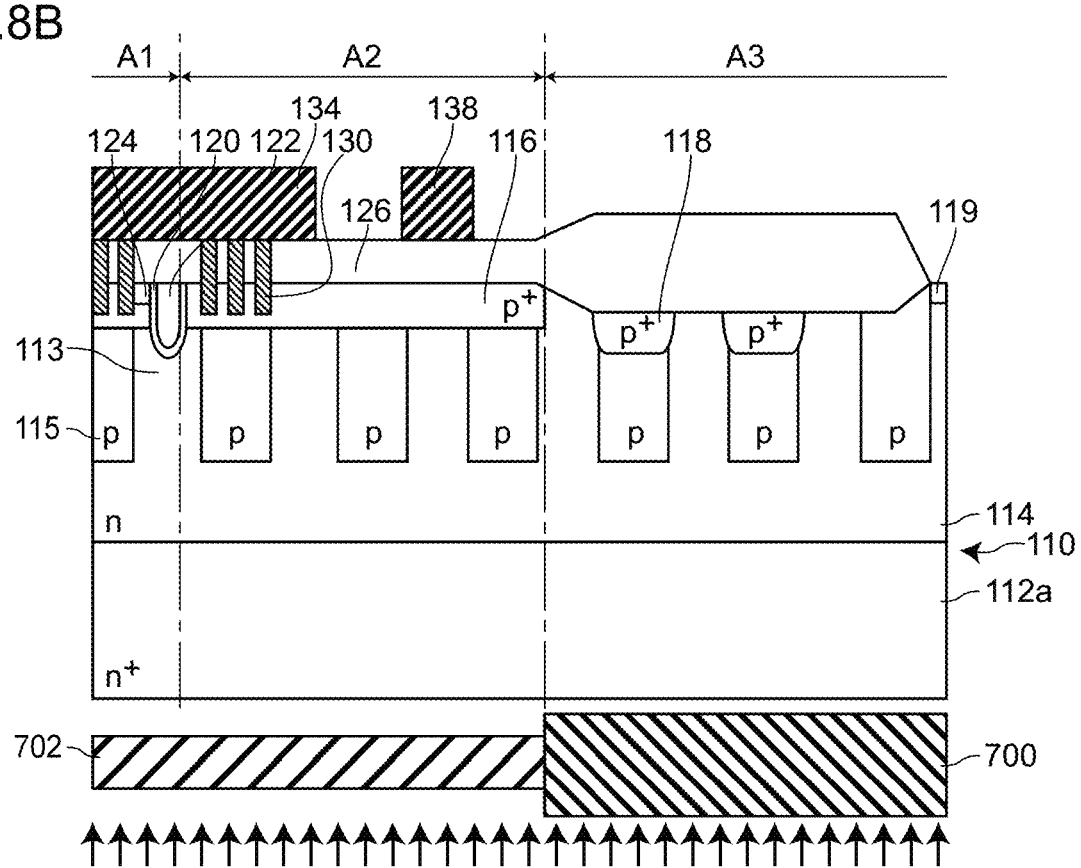

The crystal defect forming step S2 is a step of forming crystal defects in the semiconductor base substrate 110 as shown in FIG. 8B.

In the crystal defect forming step S2, out of the active region A1, the active connecting region A2, and the outer peripheral region A3 of the semiconductor base substrate 110, crystal defects are formed only in the active region A1 and the active connecting region A2.

In the crystal defect forming step S2, crystal defects are formed in a state where, in a cross section of the semiconductor base substrate 110 parallel to a depth direction of the semiconductor base substrate 110, an outer end of an outermost portion which is formed of either one of the source region 124 and the gate electrode 122 capable of providing a main operation as the MOSFET 100 forms a boundary between the active region A1 and the active connecting region A2, and an outer end of the base region 116 forms a boundary between the active connecting region A2 and the outer peripheral region A3.

In the crystal defect forming step S2, crystal defects are formed such that density of the crystal defects is locally increased as viewed along a depth direction.

In the crystal defect forming step S2, crystal defects are formed such that, using the first main surface of the semiconductor base substrate 110 in the active region A1 as a reference and assuming a depth to a deepest portion of the super junction structure as Dp, a depth at which density of the crystal defects exhibits a maximum value as Dd, and a half value width of density distribution of the crystal defects as W, a relationship of $0.25Dp \leq Dd \leq 1.1Dp$ and a relationship of $0.05Dp<W<0.5Dp$ are satisfied.

In the crystal defect forming step S2, it is preferable that the crystal defects be formed such that a relationship of $0.4Dp \leq Dd < 0.9Dp$ is satisfied.

In the crystal defect forming step S2, it is preferable that the crystal defects be formed such that a relationship of $(Dp-Dd)>0.5W$ is satisfied.

In the crystal defect forming step S2 in the embodiment, Dd is specifically 0.6Dp.

In the crystal defect forming step S2, crystal defects are formed by He irradiation or proton irradiation.

The crystal defects are formed by limiting regions such that He irradiation or proton irradiation is performed by arranging a mask (a member which prevents penetration of He or protons) 700 such that the mask covers a region (outer peripheral region A3) where the formation of crystal defects is not desirable.

With respect to the depth Dd at which density of crystal defects exhibits a maximum value, for example, the depth can be adjusted based on energy of He irradiation or proton irradiation and using an absorber 702 (a member which adjusts a flying distance of He or protons by allowing He or protons to pass therethrough). The absorber 702 is made of aluminum, for example.

The adjustment of the depth Dd at which density of crystal defects exhibits a maximum value (adjustment of a flying distance of ion species) is not always necessary to perform by the absorber 702.

First, assume a distance as viewed along a depth direction from a surface (back surface) of the portion 112a which becomes the low-resistance semiconductor layer 112 on a side opposite to a first main surface of the portion 112a to the depth Dd at which density of crystal defects exhibits a maximum value as Dbd. With respect to predetermined irradiation energy in the He irradiation or in the proton irradiation, in the case where a flying distance Rp in a material (silicon) which forms the predetermined structural body 100a is equal to the distance Dbd or in the case where a thickness of the portion 112a which becomes the low-resistance semiconductor layer 112 is adjusted such that the flying distance Rp becomes equal to the distance Dbd, crystal defects can be formed at an appropriate depth without using the absorber 702.

The case where the absorber 702 becomes necessary is the case where a relationship of Rp>Dbd is satisfied. In this case, The absorber 702 having a thickness at which a speed reduction amount of ion species in the absorber 702 becomes equal to a speed reduction amount in silicon having a thickness substantially obtained by Rp−Dbd (a thickness obtained using a conversion coefficient) is used.

For example, in the case where a material which forms the semiconductor base substrate 110 is silicon, and the absorber 702 made of aluminum is used, a conversion coefficient from silicon to aluminum is a value slightly lower than 1 and hence, as described above, the thickness of the absorber 702 is set slightly smaller than the thickness obtained by Rp−Dbd.

In the case where a relationship of Rp<Dbd is established, the depth Dd at which density of crystal defects exhibits a maximum value cannot be properly adjusted by the absorber 702 and hence, it is necessary to decrease a thickness of the portion 112a which becomes the low-resistance semiconductor layer 112 by back grinding or the like.

A half value width of density distribution of crystal defects can be adjusted based on energy of He irradiation or proton irradiation. The half value width of density distribution of crystal defects can be decreased by decreasing such energy, and the half value width of density distribution of crystal defects can be increased by increasing such energy.

A dose amount of He irradiation or proton irradiation falls within a range of $5\times10^{10}/cm^2$ to $2\times10^{12}/cm^2$.

Energy of He irradiation or proton irradiation differs depending on a thickness of the predetermined structural body 100a or ion species to be used. However, in general, energy is set to a value which falls within a range of 1 MeV to 40 MeV, for example.

As main ion species which can be used in He irradiation, $^{3}He^{2+}$, $^{4}He^{2+}$, $^{3}He^{+}$, and $^{4}He^{+}$ can be named.

The annealing step S3 is a step where annealing is performed at a temperature of 300° C. to 500° C. (not shown in the drawing). By performing annealing, undesired crystal defects attributed to He irradiation or proton irradiation can be extinguished and, at the same time, density of crystal defects can be adjusted. From a viewpoint of acquiring a sufficient annealing effect and from a viewpoint of leaving a sufficient amount of crystal defects, it is preferable that an annealing time be 0.5 hours to 5 hours. It is more preferable that the annealing time be 1 hour to 2 hours.

In the case where a polyimide-based resin is used on a first main surface side of the predetermined structural body 100a (particularly, a peripheral region), it is preferable to set an annealing temperature to 350° C. or below for preventing degradation or the like of the polyimide-based resin.

Figure 9A:
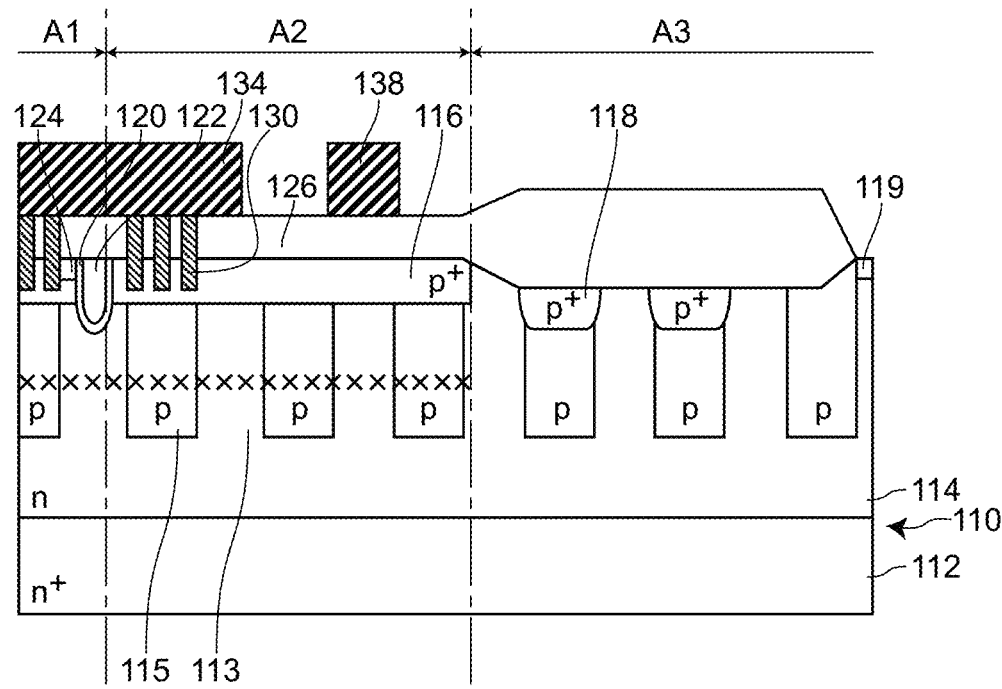
FIGS. 9A and 9B are views for describing the method of manufacturing a MOSFET according to the embodiment.

As shown in FIG. 9A, the back grinding step S4 is a step of forming the low-resistance semiconductor layer 112 by reducing a thickness of the portion 112a which becomes the low-resistance semiconductor layer 112. The back grinding step S4 also has an effect of cleaning a surface of the low-resistance semiconductor layer 112.

In the case where a thickness of the portion 112a which becomes the low-resistance semiconductor layer 112 is already substantially equal to a thickness of the low-resistance semiconductor layer 112, and a surface (an exposed surface) of the portion 112a which becomes the low-resistance semiconductor layer 112 is sufficiently cleaned (adhesion of smears being sufficiently small), this step may be omitted.

Figure 9B:
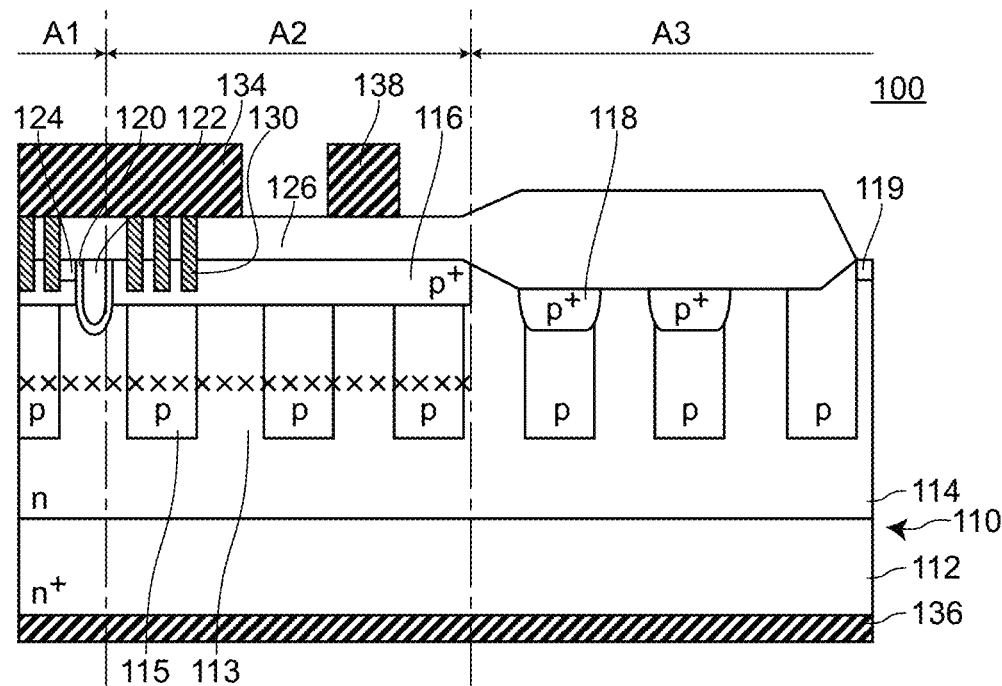

As shown in FIG. 9B, the drain electrode forming step S5 is a step of forming the drain electrode 136 by forming a metal film on the low-resistance semiconductor layer 112.

The MOSFET 100 according to the embodiment can be manufactured in accordance with the above-mentioned steps.

4. Advantageous effects acquired by MOSFET 100, method of manufacturing MOSFET, and power conversion circuit according to the embodiment.

Hereinafter, advantageous effects acquired by the MOSFET 100, the method of manufacturing a MOSFET, and the power conversion circuit according to the embodiment are described.

According to the MOSFET 100 of the embodiment, crystal defects are formed in the semiconductor base substrate 110. Accordingly, in the same manner as the conventional MOSFET, carriers can be recoupled at the crystal defects (a lifetime of carriers can be controlled) at the time of reverse recovery of a body diode. As a result, the carriers can be extinguished even when the carriers do not move to an electrode. Accordingly, in the MOSFET 100 of the embodiment, a switching speed can be increased by shortening a reverse recovery time (Trr). As a result, a reverse recovery charge amount (Qrr) can be reduced thus providing a MOSFET which can reduce a recovery loss.

In the MOSFET 100 according to the embodiment, out of the active region A1, the active connecting region A2, and the outer peripheral region A3 of the semiconductor base substrate 110, the crystal defects are formed only in the active region A1 and the active connecting region A2. That is, crystal defects are not formed in the outer peripheral region A3. Accordingly, at the time of reverse recovery of the body diode, carriers in the outer peripheral region A3 are minimally recoupled and hence, in the outer peripheral region A3, carriers are moved to the electrode and then are drawn out.

Accordingly, in the MOSFET 100 of the embodiment, timing that carriers in the outer peripheral region A3 are extinguished is delayed compared to timing that carriers in the active region A1 and the active connecting region A2 are extinguished and hence, because of an effect of the carriers remaining in the outer peripheral region A3, a reverse recovery current (Irr) is gradually decreased (a recovery waveform can be softened).

As a result, according to the MOSFET 100 of the embodiment, it is possible to prevent the occurrence of a phenomenon that a reverse recovery current (Irr) becomes rapidly small (dIr/dt becoming large) after the reverse recovery current (Irr) passes a peak value (Irp). Accordingly, it is possible to suppress the increase of an induced electromotive force generated by a parasitic inductance component.

That is, the MOSFET 100 according to the embodiment becomes a MOSFET where oscillation is generated in a small amount compared to conventional MOSFETs.

Accordingly, the MOSFET 100 according to the embodiment becomes a MOSFET which can reduce a recovery loss and in which oscillation is generated in a small amount compared to conventional MOSFETs.

In the MOSFET 100 according to the embodiment, the semiconductor base substrate 110 further includes the base region 116 and the source region 124, and MOSFET 100 further includes the interlayer insulation film 126 and the source electrode 134, and in a cross section of the semiconductor base substrate 110 parallel to a depth direction of the semiconductor base substrate 110, an outer end of an outermost portion which is formed of either one of the source region 124 and the gate electrode 122 capable of providing a main operation as the MOSFET 100 forms a boundary between the active region A1 and the active connecting region A2, and an outer end of the base region 116 forms a boundary between the active connecting region A2 and the outer peripheral region A3. Accordingly, the boundary between the respective regions can be clarified so that crystal defects can be formed with high accuracy whereby a control of reducing a recovery loss and a control of making the generation of oscillations difficult can be performed with high accuracy.

Further, according to the MOSFET 100 of this embodiment, a relationship of $S3>(S1+S2+S3)\times 0.05\times (VDSS/600)$ is satisfied. Accordingly, a rate that the outer peripheral region A3 occupies on the semiconductor base substrate 110 can be sufficiently increased and hence, it is possible to sufficiently ensure an oscillation generation suppressing effect.

Further, according to the MOSFET 100 of the embodiment, crystal defects are formed such that density of crystal defects is locally increased as viewed along a depth direction. Accordingly, compared to the case where crystal defects are uniformly formed in the semiconductor base substrate 110, it is possible to prevent a phenomenon that carries are recoupled over a wide range formed of the p-type column regions and the n-type column regions so that a reverse recovery current (Irr) becomes further rapidly small (dIr/dt becoming large) after the reverse recovery current (Irr) passes a peak value (Irp) and, at the same time, it is possible to sufficiently control a lifetime of carriers by properly ensuring distribution of crystal defects.

According to the MOSFET 100 of the embodiment, the relationship of $0.25Dp \leq Dd \leq 1.1Dp$ is satisfied. Accordingly, a time until carriers present in the vicinity of the deepest portion of the super junction structure are recoupled becomes relatively long and hence, it is possible to suppress with more certainty a rapid expansion of a depletion layer from the pn junction at the time of reverse recovery of the body diode. As a result, according to the MOSFET 100 of the embodiment, it is possible to prevent with more certainty the occurrence of a phenomenon that a reverse recovery current (Irr) becomes rapidly small (dIr/dt becoming large)

after the reverse recovery current (Irr) passes a peak value (Irp). Accordingly, it is possible to suppress the increase of an induced electromotive force generated by a parasitic inductance component. As a result, the MOSFET 100 according to this embodiment becomes a MOSFET where oscillation is further minimally generated.

According to the MOSFET 100 of this embodiment, the relationship of 0.05Dp<W<0.5Dp is satisfied. Accordingly, it is possible to prevent with more certainty a phenomenon that carriers are recoupled over a wide range formed of the p-type column regions and the n-type column regions so that, eventually, a reverse recovery current (Irr) becomes further rapidly small (dIr/dt becoming large) after the reverse recovery current (Irr) passes a peak value (Irp). Further, a lifetime of carriers can be controlled with more certainty by properly ensuring distribution of crystal defects.

The method of manufacturing a MOSFET according to the embodiment includes the crystal defect forming step S2 where crystal defects are formed in the semiconductor base substrate 110, and in the crystal defect forming step S2, out of the active region A1, the active connecting region A2, and the outer peripheral region A3 of the semiconductor base substrate 110, the crystal defects are formed only in the active region A1 and the active connecting region A2. Accordingly, as described previously, a recovery loss can be reduced and, at the same time, it is possible to manufacture the MOSFET 100 where oscillation is generated in a small amount compared to conventional MOSFETs.

In the method of manufacturing a MOSFET according to the embodiment, the semiconductor base substrate 110 of the predetermined structural body 100a prepared in the preparation step S1 further includes the base region 116 and the source region 124, the predetermined structural body 100a prepared in the preparation step S1 further includes the interlayer insulation film 126 and the source electrode 134. In the crystal defect forming step S2, crystal defects are formed in a state where, in a cross section of the semiconductor base substrate 110 parallel to a depth direction of the semiconductor base substrate 110, an outer end of an outermost portion which is formed of either one of the source region 124 and the gate electrode 122 capable of providing a main operation as the MOSFET 100 forms a boundary between the active region A1 and the active connecting region A2, and an outer end of the base region 116 forms a boundary between the active connecting region A2 and the outer peripheral region A3. Accordingly, the boundary between the respective regions can be clarified so that crystal defects can be formed with high accuracy whereby a control of reducing a recovery loss and a control of making the generation of oscillations difficult can be performed with high accuracy.

Further, according to the method of manufacturing a MOSFET of this embodiment, a predetermined structural body which satisfies the relationship of S3>(S1+S2+S3)× 0.05×(VDSS/600) is prepared as the predetermined structural body 100a. Accordingly, a rate that the outer peripheral region A3 occupies on the semiconductor base substrate 110 can be sufficiently increased and hence, it is possible to sufficiently ensure an oscillation generation suppressing effect in the MOSFET 100 to be manufactured.

In the method of manufacturing a MOSFET according to the embodiment, in the crystal defect forming step S2, the crystal defects are formed such that density of the crystal defects is locally increased as viewed along a depth direction. Accordingly, in the MOSFET 100 to be manufactured, compared to the case where crystal defects are uniformly formed in the semiconductor base substrate 110, it is pos- sible to prevent a phenomenon that carriers are recoupled over a wide range formed of the p-type column regions and the n-type column regions so that a reverse recovery current (Irr) becomes further rapidly small (dIr/dt becoming large) after the reverse recovery current (Irr) passes a peak value (Irp) and, at the same time, it is possible to sufficiently control a lifetime of carriers by properly ensuring distribution of crystal defects.

According to the method of manufacturing a MOSFET of the embodiment, in the crystal defect forming step S2, crystal defects are formed so as to satisfy the relationship of 0.25Dp≤Dd≤1.1Dp. Accordingly, in the MOSFET 100 to be manufactured, a time until carriers present in the vicinity of the deepest portion of the super junction structure are recoupled becomes relatively long and hence, it is possible to suppress with more certainty a rapid expansion of a depletion layer from the pn junction at the time of reverse recovery of the body diode. As a result, it is possible to prevent with more certainty the occurrence of a phenomenon that a reverse recovery current (Irr) becomes rapidly small (dIr/dt becoming large) after the reverse recovery current (Irr) passes a peak value (Irp). Accordingly, it is possible to suppress the increase of an induced electromotive force generated by a parasitic inductance component. As a result, the MOSFET 100 where oscillation is further minimally generated can be manufactured.

According to the method of manufacturing a MOSFET of this embodiment, in the crystal defect forming step S2, crystal defects are formed so as to satisfy the relationship of 0.05Dp<W<0.5Dp. Accordingly, in the MOSFET 100 to be manufactured, it is possible to prevent with more certainty a phenomenon that carriers are recoupled over a wide range formed of the p-type column regions and the n-type column regions so that, eventually, a reverse recovery current (Irr) becomes further rapidly small (dIr/dt becoming large) after the reverse recovery current (Irr) passes a peak value (Irp). Further, a lifetime of carriers can be controlled with more certainty by properly ensuring distribution of crystal defects.

According to the method of manufacturing a MOSFET of this embodiment, in the crystal defect forming step S2, crystal defects are formed by He irradiation or proton irradiation. Accordingly, proper crystal defects suitable for a lifetime control can be formed.

The power conversion circuit 1 according to the embodiment includes the MOSFET 100 where out of the active region A1, the active connecting region A2, and the outer peripheral region A3 of the semiconductor base substrate 110, the crystal defects are formed only in the active region A1 and the active connecting region A2. Accordingly, as described previously, a recovery loss can be reduced and, at the same time, it is possible to provide the high quality power conversion circuit which uses the MOSFET 100 where oscillation is generated in a small amount compared to conventional MOSFETs.

The present invention has been described heretofore based on the above-mentioned embodiment. However, the present invention is not limited to the above-mentioned embodiment. The present invention can be carried out in various modes without departing from the gist of the present invention. For example, the following modifications are conceivable.

(1) The shapes, the numbers, the positions and the like of the constitutional elements described in the above-mentioned embodiment are provided for an exemplifying purpose, and these values can be changed within a range that advantageous effects of the present invention are not impaired.

(2) In the above-mentioned embodiment, the depth Dd at which density of crystal defects exhibits a maximum value is set to 0.6Dp (Dp being a depth to a deepest portion of the super junction structure), and a half value width W of density distribution of crystal defects is set to 0.3Dp. However, the present invention is not limited to such a configuration. The depth Dd at which density of crystal defects exhibits a maximum value and the half value width W of density distribution of crystal defects can be freely set within a range where advantageous effects of the present invention are not impaired. However, when the depth Dd and the half value width W are set to extremely large or small values, possibility that advantageous effects of the present invention are impaired is increased. Accordingly, as described previously, it is preferable that the depth Dd at which density of crystal defects exhibits a maximum value satisfy the relationship of $0.25Dp \leq Dd < 1.1Dp$. It is more preferable that the depth Dd at which density of crystal defects exhibits a maximum value satisfy the relationship of $0.25Dp \leq Dd < 0.95Dp$. It is still more preferable that the depth Dd at which density of crystal defects exhibits a maximum value satisfy the relationship of $0.4Dp \leq Dd < 0.9Dp$. Further, it is preferable that the half value width W of density distribution of crystal defects satisfy the relationship of $0.05Dp < W < 0.5Dp$.

Figure 10:
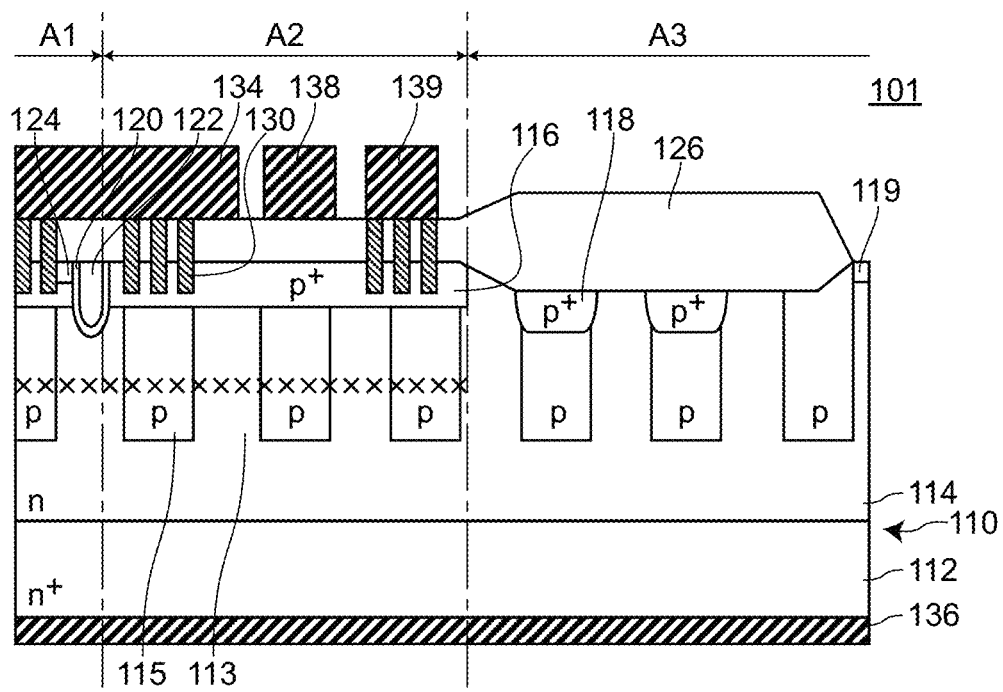
FIG. 10 is a cross-sectional view showing the configuration of a part of a MOSFET 101 according to a modification 1.

(3) The MOSFET according to the present invention may further include, as in the case of a MOSFET 101 according to a modification 1 shown in FIG. 10, a routing source line electrically connected to the source electrode (see routing source line 139 shown in FIG. 10). In this case, the routing source line is disposed in the active connecting region.

Figure 11:
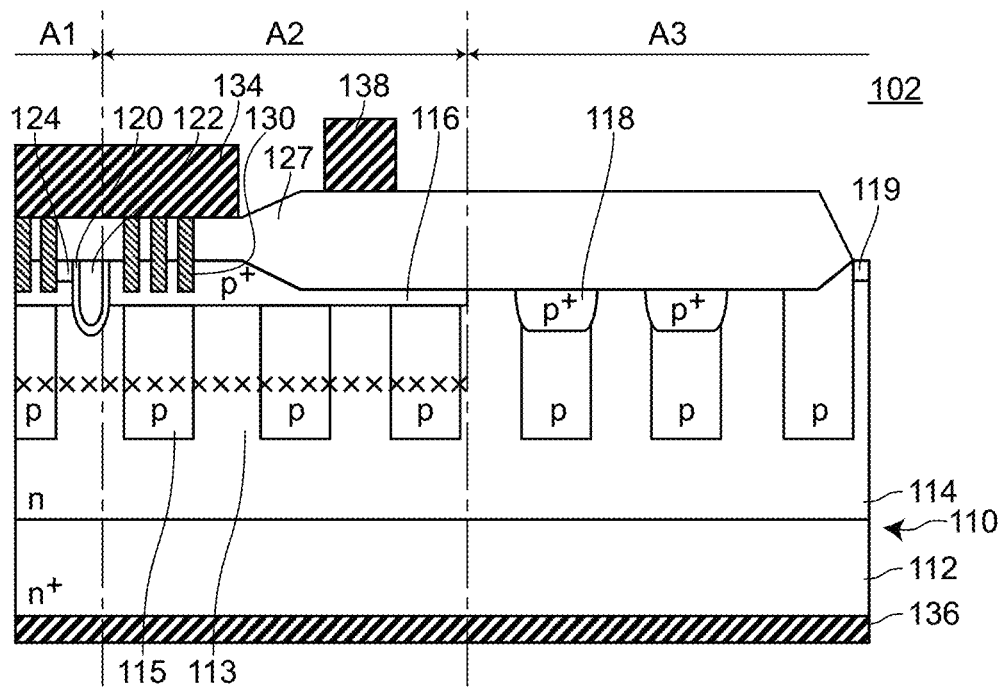
FIG. 11 is a cross-sectional view showing the configuration of a part of a MOSFET 102 according to a modification 2.

(4) In the MOSFET of the present invention, as in the case of a MOSFET 102 according to a modification 2 shown in FIG. 11, an end portion of a field insulation film (a portion where a thickness of the insulation film is started to be increased) may be included in an active connecting region A2 (see a portion indicated by symbol 127 in an interlayer insulation film 127 in FIG. 11 and a region of the interlayer insulation film 127 in the vicinity of the portion). That is, with respect to the field insulation film, both the case where the field insulation film overlaps with the base region 116 and the case where the field insulation film does not overlap with the base region 116 are considered. Both cases fall within the scope of the present invention.

(5) In the above-mentioned embodiment, the semiconductor base substrate 110 of the MOSFET 100 has the guard rings 118 in the outer peripheral region A3 as the structure which ensures withstand voltage. However, the present invention is not limited to such a configuration. The MOSFET according to the present invention may include a structure for ensuring a withstand voltage other than guard rings (for example, field plates) in place of the guard rings. The MOSFET according to the present invention may include such a structure together with the guard rings. In the case where the MOSFET of the present invention can ensure a sufficient withstand voltage only with the presence of the outer peripheral region, it is unnecessary to provide a particular structure for ensuring a withstand voltage to the outer peripheral region.

Figure 12:
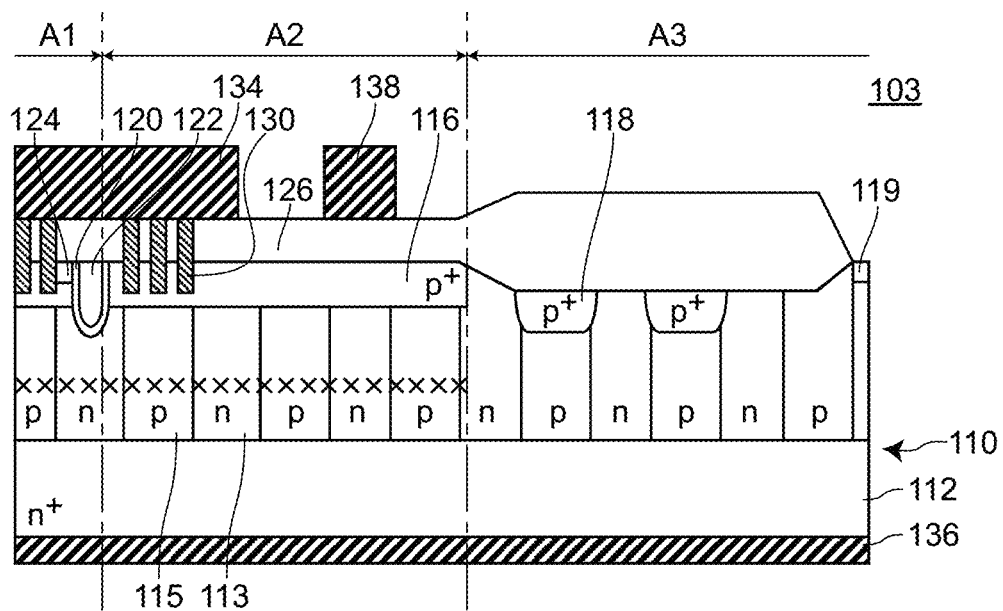
FIG. 12 is a cross-sectional view showing the configuration of a part of a MOSFET 103 according to a modification 3.

(6) In the above-mentioned embodiment, the buffer layer 114 of an n-type exists between the low-resistance semiconductor layer 112 on one side and the n-type column regions 113 and the p-type column regions 115 (super junction structure) on the other side. However, the present invention is not limited to such a configuration. As shown in FIG. 12, the low-resistance semiconductor layer 112 on one side and the n-type column regions 113 and the p-type column regions 115 on the other side may be directly brought into contact with each other.

(7) In the above-mentioned embodiment, He irradiation or proton irradiation is performed from a side opposite to the first main surface in the crystal defect forming step S2. However, the present invention is not limited to such a case. In the crystal defect forming step, He irradiation or proton irradiation may be performed from a first main surface side. However, in this case, there is a possibility that qualities of the gate insulation film, the interlayer insulation film, and a passivation film on the first main surface side are affected by irradiation and hence, it is preferable to perform He irradiation or proton irradiation from the side opposite to the first main surface as in the case of the above-mentioned embodiment.

(8) In the above-mentioned embodiment, the back grinding step S4 and the drain electrode forming step S5 are performed after the crystal defect forming step S2. However, the present invention is not limited such a procedure. The back grinding step may be performed before the crystal defect forming step or the drain electrode forming step may be also performed when the back grinding step is performed. However, there is a possibility that the structure on a drain electrode side is affected by irradiation and hence, it is preferable to perform the back grinding step and the drain electrode forming step after the crystal defect forming step as in the case of the above-mentioned embodiment.

Figure 13:
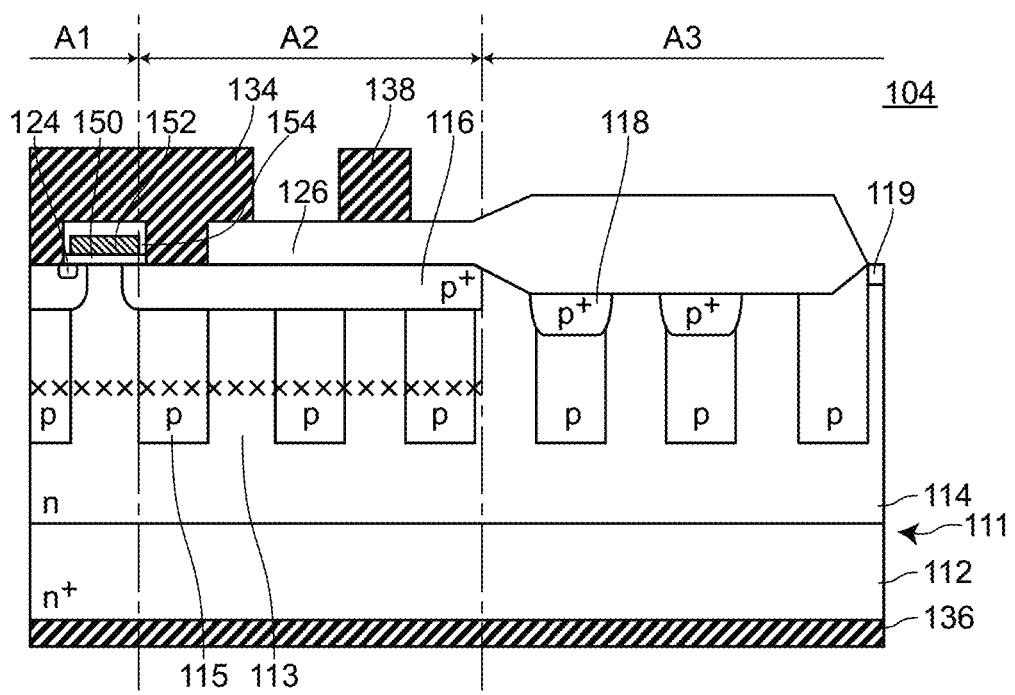
FIG. 13 is a cross-sectional view showing the configuration of a part of a MOSFET 104 according to a modification 4.

(9) In the above-mentioned embodiment, the present invention has been described using the so-called trench-gate-type MOSFET 100. However, the present invention is not limited to such a MOSFET. For example, as shown in FIG. 13, the present invention is also applicable to a so-called planar-gate-type MOSFET. A MOSFET 104 according to a modification 4 shown in FIG. 13 includes a semiconductor base substrate 111, a gate insulation film 150, a gate electrode 152, and an interlayer insulation film 154 which correspond to the planar-gate-type MOSFET.

(10) In the above-mentioned respective embodiments, the present invention has been described using the MOSFET 100 which includes the metal plugs 130. However, the present invention is not limited to such a configuration. The present invention is also applicable to a MOSFET which does not include the metal plugs.

(11) The present invention is also applicable to embodiments where the arrangement of n-type and p-type is opposite compared to the above-mentioned respective embodiments.

The invention claimed is:
1. A MOSFET, comprising:
a semiconductor base substrate having an n-type column region and a p-type column region, the n-type column region and the p-type column region forming a super junction structure; and
a gate electrode formed on a first main surface side of the semiconductor base substrate by way of a gate insulation film, wherein
assuming a region of the semiconductor base substrate which provides a main operation of the MOSFET as an active region, a region of the semiconductor base substrate disposed on an outer peripheral side of the active region and maintaining a withstand voltage of the MOSFET as an outer peripheral region, and a region of the semiconductor base substrate disposed between the active region and the outer peripheral region as an active connecting region, out of the active region, the active connecting region, and the outer peripheral region of the semiconductor base substrate, crystal defects are formed only in the active region and the active connecting region, and as viewed in a plan view of the semiconductor base substrate, assuming a total area of the active region as S1, a total area of the active connecting region as S2, and a total area of the outer peripheral region as S3, and assuming the withstand voltage of the MOSFET as VDSS, a relationship of S3>(S1+S2+S3)×0.05×(VDSS/600) is satisfied.

2. The MOSFET according to claim 1, wherein the semiconductor base substrate further includes:
  a base region of a first conductive type formed on the first main surface side of the n-type column region and the first main surface side of the p-type column region; and
  a source region of a second conductive type formed on a first main surface side of the base region and being in contact with the gate insulation film, the MOSFET further comprises:
  an interlayer insulation film formed so as to cover the base region, the gate insulation film, the gate electrode, and the source region; and
  a source electrode formed on a surface of the interlayer insulation film and electrically connected with the base region and the source region, and in a cross section of the semiconductor base substrate parallel to a depth direction of the semiconductor base substrate,
  an outer end of an outermost portion which is formed of either one of the source region and the gate electrode capable of providing a main operation as the MOSFET forms a boundary between the active region and the active connecting region, and
  an outer end of the base region forms a boundary between the active connecting region and the outer peripheral region.

3. The MOSFET according to claim 1, wherein the crystal defects are formed such that density of the crystal defects is locally increased as viewed along a depth direction.

4. The MOSFET according to claim 3, wherein using the first main surface of the semiconductor base substrate in the active region as a reference and assuming a depth to a deepest portion of the super junction structure as Dp, a depth at which density of the crystal defects exhibits a maximum value as Dd, and a half value width of density distribution of the crystal defects as W, a relationship of $0.25Dp \leq Dd \leq 1.1Dp$ and a relationship of $0.05Dp < W < 0.5Dp$ are satisfied.

5. A method of manufacturing a MOSFET, the MOSFET comprising:
  a semiconductor base substrate having an n-type column region and a p-type column region, the n-type column region and the p-type column region forming a super junction structure; and
  a gate electrode formed on a first main surface side of the semiconductor base substrate by way of a gate insulation film, wherein
  assuming a region of the semiconductor base substrate which provides a main operation of the MOSFET as an active region, a region of the semiconductor base substrate disposed on an outer peripheral side of the active region and maintaining a withstand voltage of the MOSFET as an outer peripheral region, and a region of the semiconductor base substrate disposed between the active region and the outer peripheral region as an active connecting region, out of the active region, the active connecting region, and the outer peripheral region of the semiconductor base substrate, the crystal defects are formed only in the active region and the active connecting region, and as viewed in a plan view of the semiconductor base substrate, assuming a total area of the active region as S1, a total area of the active connecting region as S2, and a total area of the outer peripheral region as S3, and assuming the withstand voltage of the MOSFET as VDSS, a relationship of S3>(S1+S2+S3)×0.05×(VDSS/600) is satisfied, the method comprising in a following order:
a preparation step where a predetermined structural body is prepared, the predetermined structural body including:
  the semiconductor base substrate having the n-type column region and the p-type column region forming the super junction structure; and
  the gate electrode formed on the first main surface side of the semiconductor base substrate by way of gate insulation film; and
a crystal defect forming step where the crystal defects are formed in the semiconductor base substrate, wherein
in the crystal defect forming step, out of the active region, the active connecting region, and the outer peripheral region of the semiconductor base substrate, the crystal defects are formed only in the active region and the active connecting region, and
in the preparation step, the predetermined structural body is prepared to satisfy the relationship of S3>(S1+S2+S3)×0.05×(VDSS/600).

6. The method of manufacturing a MOSFET according to claim 5, wherein
the semiconductor base substrate of the predetermined structural body prepared in the preparation step further includes:
  a base region of a first conductive type formed on the first main surface side of the n-type column region and the first main surface side of the p-type column region; and
  a source region of a second conductive type formed on a first main surface side of the base region and being in contact with the gate insulation film, the predetermined structural body prepared in the preparation step further includes:
  an interlayer insulation film formed so as to cover the base region, the gate insulation film, the gate electrode, and the source region; and
  a source electrode formed on a surface of the interlayer insulation film and electrically connected with the base region and the source region, and in the crystal defect forming step, crystal defects are formed in a state where, in a cross section of the semiconductor base substrate parallel to a depth direction of the semiconductor base substrate,
  an outer end of an outermost portion which is formed of either one of the source region and the gate electrode capable of providing a main operation as the MOSFET forms a boundary between the active region and the active connecting region, and
  an outer end of the base region forms a boundary between the active connecting region and the outer peripheral region.

7. The method of manufacturing a MOSFET according to claim 5, wherein in the crystal defect forming step, the crystal defects are formed such that density of the crystal defects is locally increased as viewed along a depth direction.

8. The method of manufacturing a MOSFET according to claim 7, wherein in the crystal defect forming step, the crystal defects are formed such that, using the first main surface of the semiconductor base substrate in the active region as a reference and assuming a depth to a deepest portion of the super junction structure as Dp, a depth at which density of the crystal defects exhibits a maximum value as Dd, and a half value width of density distribution of the crystal defects as W, a relationship of $0.25D_p \leq D_d \leq 1.1D_p$ and a relationship of $0.05D_p < W < 0.5D_p$ are satisfied.

9. The method of manufacturing a MOSFET according to claim 5, wherein in the crystal defect forming step, the crystal defects are formed by He irradiation or by proton irradiation.

10. A power conversion circuit comprising:
a MOSFET for making a forward current flow into a body diode;
a switching element; and
an inductive load, wherein
the MOSFET includes:
a semiconductor base substrate having an n-type column region and a p-type column region, the n-type column region and the p-type column region forming a super junction structure; and
a gate electrode formed on a first main surface side of the semiconductor base substrate by way of a gate insulation film,
assuming a region of the semiconductor base substrate which provides a main operation of the MOSFET as an active region, a region of the semiconductor base substrate disposed on an outer peripheral side of the active region and maintaining a withstand voltage of the MOSFET as an outer peripheral region, and a region of the semiconductor base substrate disposed between the active region and the outer peripheral region as an active connecting region,
out of the active region, the active connecting region, and the outer peripheral region of the semiconductor base substrate, the crystal defects are formed only in the active region and the active connecting region, and
as viewed in a plan view of the semiconductor base substrate, assuming a total area of the active region as S1, a total area of the active connecting region as S2, and a total area of the outer peripheral region as S3, and assuming the withstand voltage of the MOSFET as VDSS, a relationship of $S3 > (S1+S2+S3) \times 0.05 \times (VDSS/600)$ is satisfied.

* * * * *